(12) United States Patent
Pope et al.

(10) Patent No.: US 9,723,680 B2
(45) Date of Patent: Aug. 1, 2017

(54) DIGITALLY CONTROLLED DRIVER FOR LIGHTING FIXTURE

(71) Applicant: Cree, Inc., Durham, NC (US)

(72) Inventors: Daniel J. Pope, Morrisville, NC (US); Andrew Dummer, Chapel Hill, NC (US); James McBryde, Raleigh, NC (US); Heidi Loepp, Cary, NC (US); P. Joseph DeSena, Jr., Raleigh, NC (US); Priyanka S Medida, Morrisville, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/292,332

(22) Filed: May 30, 2014

(65) Prior Publication Data

US 2015/0351169 A1 Dec. 3, 2015

(51) Int. Cl.
*H05B 33/08* (2006.01)
*H05B 37/02* (2006.01)

(52) U.S. Cl.
CPC ....... *H05B 33/086* (2013.01); *H05B 33/0803* (2013.01); *H05B 37/0272* (2013.01)

(58) Field of Classification Search
CPC ... F21K 9/00; H05B 33/0863; H05B 33/0857; H05B 33/0815
USPC .......... 315/291, 297, 192; 362/231, 230, 84; 313/1
See application file for complete search history.

(56) References Cited

U.S. PATENT DOCUMENTS

| D259,514 | S | 6/1981 | Welch |
|---|---|---|---|
| D317,363 | S | 6/1991 | Welch |
| 5,079,680 | A | 1/1992 | Kohn |
| D344,361 | S | 2/1994 | Friedman et al. |
| D349,582 | S | 8/1994 | Bain et al. |
| 5,471,119 | A | 11/1995 | Ranganath et al. |
| D373,438 | S | 9/1996 | McCann-Compton et al. |
| 6,100,643 | A | 8/2000 | Nilssen |
| 6,118,230 | A | 9/2000 | Fleischmann |
| 6,137,408 | A | 10/2000 | Okada |
| 6,160,359 | A | 12/2000 | Fleischmann |
| 6,166,496 | A | 12/2000 | Lys et al. |
| 6,437,692 | B1 | 8/2002 | Petite et al. |
| 6,441,558 | B1 | 8/2002 | Muthu et al. |
| 6,528,954 | B1 | 3/2003 | Lys et al. |
| 6,553,218 | B1 | 4/2003 | Boesjes |
| 6,735,630 | B1 | 5/2004 | Gelvin et al. |
| 6,804,790 | B2 | 10/2004 | Rhee et al. |

(Continued)

FOREIGN PATENT DOCUMENTS

| AT | 492840 T | 1/2011 |
|---|---|---|
| AU | 3666702 A | 5/2002 |

(Continued)

OTHER PUBLICATIONS

Notice of Allowance for U.S. Appl. No. 13/782,068, mailed Oct. 1, 2015, 7 pages.

(Continued)

*Primary Examiner* — Douglas W Owens
*Assistant Examiner* — Wei Chan
(74) *Attorney, Agent, or Firm* — Withrow & Terranova, P.L.L.C.

(57) ABSTRACT

The present disclosure relates to a lighting fixture that is capable of providing white light over an extended range of correlated color temperatures.

30 Claims, 27 Drawing Sheets

(56) References Cited

U.S. PATENT DOCUMENTS

| | | |
|---|---|---|
| 6,826,607 B1 | 11/2004 | Gelvin et al. |
| 6,832,251 B1 | 12/2004 | Gelvin et al. |
| 6,859,831 B1 | 2/2005 | Gelvin et al. |
| 6,914,893 B2 | 7/2005 | Petite |
| 6,975,851 B2 | 12/2005 | Boesjes |
| 6,990,394 B2 | 1/2006 | Pasternak |
| 7,009,348 B2 | 3/2006 | Mogilner et al. |
| 7,020,701 B1 | 3/2006 | Gelvin et al. |
| 7,031,920 B2 | 4/2006 | Dowling et al. |
| 7,103,511 B2 | 9/2006 | Petite |
| 7,139,562 B2 | 11/2006 | Matsui |
| 7,288,902 B1 | 10/2007 | Melanson |
| 7,305,467 B2 | 12/2007 | Kaiser et al. |
| 7,313,399 B2 | 12/2007 | Rhee et al. |
| D560,006 S | 1/2008 | Garner et al. |
| 7,344,279 B2 | 3/2008 | Mueller et al. |
| D565,771 S | 4/2008 | Garner et al. |
| D567,431 S | 4/2008 | Garner et al. |
| 7,391,297 B2 | 6/2008 | Cash et al. |
| D582,598 S | 12/2008 | Kramer et al. |
| 7,468,661 B2 | 12/2008 | Petite et al. |
| 7,482,567 B2 | 1/2009 | Hoelen et al. |
| 7,484,008 B1 | 1/2009 | Gelvin et al. |
| D586,950 S | 2/2009 | Garner et al. |
| D587,390 S | 2/2009 | Garner et al. |
| D588,064 S | 3/2009 | Garner et al. |
| 7,522,563 B2 | 4/2009 | Rhee |
| D594,576 S | 6/2009 | Chan et al. |
| 7,587,289 B1 | 9/2009 | Sivertsen |
| 7,606,572 B2 | 10/2009 | Rhee et al. |
| 7,649,456 B2 | 1/2010 | Wakefield et al. |
| 7,657,249 B2 | 2/2010 | Boesjes |
| 7,683,301 B2 | 3/2010 | Papamichael et al. |
| 7,697,492 B2 | 4/2010 | Petite |
| 7,797,367 B1 | 9/2010 | Gelvin et al. |
| 7,844,308 B2 | 11/2010 | Rhee et al. |
| 7,844,687 B1 | 11/2010 | Gelvin et al. |
| 7,868,562 B2 | 1/2011 | Salsbury et al. |
| 7,891,004 B1 | 2/2011 | Gelvin et al. |
| 7,904,569 B1 | 3/2011 | Gelvin et al. |
| 7,924,174 B1 | 4/2011 | Gananathan |
| 7,924,927 B1 | 4/2011 | Boesjes |
| 7,948,930 B2 | 5/2011 | Rhee |
| 8,011,794 B1 | 9/2011 | Sivertsen |
| 8,021,021 B2 | 9/2011 | Paolini |
| 8,035,320 B2 | 10/2011 | Sibert |
| 8,079,118 B2 | 12/2011 | Gelvin et al. |
| 8,098,615 B2 | 1/2012 | Rhee |
| 8,126,429 B2 | 2/2012 | Boesjes |
| 8,140,658 B1 | 3/2012 | Gelvin et al. |
| D663,048 S | 7/2012 | Chen |
| 8,228,163 B2 | 7/2012 | Cash |
| 8,271,058 B2 | 9/2012 | Rhee et al. |
| 8,274,928 B2 | 9/2012 | Dykema et al. |
| 8,275,471 B2 | 9/2012 | Huizenga et al. |
| 8,344,660 B2 | 1/2013 | Mohan et al. |
| 8,364,325 B2 | 1/2013 | Huizenga et al. |
| 8,461,781 B2 | 6/2013 | Schenk et al. |
| 8,466,626 B2 | 6/2013 | Null et al. |
| 8,497,634 B2 | 7/2013 | Scharf |
| 8,511,851 B2 | 8/2013 | Van de Ven et al. |
| 8,536,792 B1 | 9/2013 | Roosli |
| 8,536,984 B2 | 9/2013 | Benetz et al. |
| 8,604,714 B2 | 12/2013 | Mohan et al. |
| 8,610,377 B2 | 12/2013 | Chemel et al. |
| D703,841 S | 4/2014 | Feng et al. |
| D708,360 S | 7/2014 | Shibata et al. |
| 8,829,800 B2 | 9/2014 | Harris |
| 8,829,821 B2 | 9/2014 | Chobot et al. |
| 9,041,315 B2 | 5/2015 | Cho et al. |
| 9,408,268 B2 | 8/2016 | Recker et al. |
| 2002/0195975 A1 | 12/2002 | Schanberger et al. |
| 2004/0001963 A1 | 1/2004 | Watanabe et al. |
| 2004/0002792 A1 | 1/2004 | Hoffknecht |
| 2004/0051467 A1 | 3/2004 | Balasubramaniam et al. |
| 2004/0193741 A1 | 9/2004 | Pereira et al. |
| 2005/0127381 A1 | 6/2005 | Vitta et al. |
| 2005/0132080 A1 | 6/2005 | Rhee et al. |
| 2006/0022214 A1 | 2/2006 | Morgan et al. |
| 2006/0044152 A1 | 3/2006 | Wang |
| 2006/0066266 A1 | 3/2006 | Li Lim et al. |
| 2006/0125426 A1 | 6/2006 | Veskovic et al. |
| 2006/0262545 A1 | 11/2006 | Piepgras et al. |
| 2007/0040512 A1 | 2/2007 | Jungwirth et al. |
| 2007/0085700 A1 | 4/2007 | Walters et al. |
| 2007/0126656 A1* | 6/2007 | Huang ............... G09G 3/3413 345/46 |
| 2007/0132405 A1 | 6/2007 | Hillis et al. |
| 2007/0189000 A1 | 8/2007 | Papamichael et al. |
| 2007/0291483 A1 | 12/2007 | Lys |
| 2008/0031213 A1 | 2/2008 | Kaiser et al. |
| 2008/0088435 A1 | 4/2008 | Cash et al. |
| 2008/0197790 A1 | 8/2008 | Mangiaracina et al. |
| 2008/0218087 A1 | 9/2008 | Crouse et al. |
| 2008/0265799 A1* | 10/2008 | Sibert ............... H05B 37/0245 315/292 |
| 2009/0021955 A1 | 1/2009 | Kuang et al. |
| 2009/0026966 A1 | 1/2009 | Budde et al. |
| 2009/0184616 A1* | 7/2009 | Van De Ven ........ H05B 33/086 313/1 |
| 2009/0212718 A1 | 8/2009 | Kawashima et al. |
| 2009/0230894 A1 | 9/2009 | De Goederen et al. |
| 2009/0231832 A1 | 9/2009 | Zukauskas et al. |
| 2009/0284169 A1 | 11/2009 | Valois |
| 2009/0284184 A1 | 11/2009 | Valois et al. |
| 2009/0302994 A1 | 12/2009 | Rhee et al. |
| 2009/0302996 A1 | 12/2009 | Rhee et al. |
| 2009/0305644 A1 | 12/2009 | Rhee et al. |
| 2009/0315485 A1 | 12/2009 | Verfuerth et al. |
| 2009/0315668 A1 | 12/2009 | Leete, III et al. |
| 2010/0007289 A1 | 1/2010 | Budike, Jr. |
| 2010/0084992 A1 | 4/2010 | Valois et al. |
| 2010/0128634 A1 | 5/2010 | Rhee et al. |
| 2010/0134051 A1 | 6/2010 | Huizenga et al. |
| 2010/0148940 A1 | 6/2010 | Gelvin et al. |
| 2010/0150122 A1 | 6/2010 | Berger et al. |
| 2010/0201516 A1 | 8/2010 | Gelvin et al. |
| 2010/0203515 A1 | 8/2010 | Rigler |
| 2010/0270935 A1 | 10/2010 | Otake et al. |
| 2010/0295473 A1 | 11/2010 | Chemel et al. |
| 2010/0301770 A1 | 12/2010 | Chemel et al. |
| 2010/0301773 A1 | 12/2010 | Chemel et al. |
| 2010/0301774 A1 | 12/2010 | Chemel et al. |
| 2010/0308664 A1 | 12/2010 | Face et al. |
| 2011/0031897 A1 | 2/2011 | Henig et al. |
| 2011/0035491 A1 | 2/2011 | Gelvin et al. |
| 2011/0057581 A1 | 3/2011 | Ashar et al. |
| 2011/0080120 A1 | 4/2011 | Talstra et al. |
| 2011/0101871 A1 | 5/2011 | Schenk et al. |
| 2011/0115407 A1* | 5/2011 | Wibben ............. H05B 33/0815 315/294 |
| 2011/0133655 A1 | 6/2011 | Recker et al. |
| 2011/0137757 A1 | 6/2011 | Paolini et al. |
| 2011/0156596 A1 | 6/2011 | Salsbury |
| 2011/0178650 A1 | 7/2011 | Picco |
| 2011/0199004 A1 | 8/2011 | Henig et al. |
| 2011/0199020 A1 | 8/2011 | Henig et al. |
| 2011/0215725 A1 | 9/2011 | Paolini |
| 2011/0221350 A1 | 9/2011 | Staab |
| 2011/0249441 A1 | 10/2011 | Donegan |
| 2011/0254554 A1 | 10/2011 | Harbers |
| 2011/0298598 A1 | 12/2011 | Rhee |
| 2012/0007725 A1 | 1/2012 | Penisoara et al. |
| 2012/0013257 A1 | 1/2012 | Sibert |
| 2012/0026733 A1 | 2/2012 | Graeber et al. |
| 2012/0040606 A1 | 2/2012 | Verfuerth |
| 2012/0050535 A1 | 3/2012 | Densham et al. |
| 2012/0079149 A1 | 3/2012 | Gelvin et al. |
| 2012/0082062 A1 | 4/2012 | Mccormack |
| 2012/0086345 A1 | 4/2012 | Tran |
| 2012/0087290 A1 | 4/2012 | Rhee et al. |
| 2012/0091915 A1 | 4/2012 | Ilyes et al. |
| 2012/0130544 A1 | 5/2012 | Mohan et al. |
| 2012/0135692 A1 | 5/2012 | Feri et al. |

(56) References Cited

U.S. PATENT DOCUMENTS

| | | |
|---|---|---|
| 2012/0136485 A1 | 5/2012 | Weber et al. |
| 2012/0139426 A1 | 6/2012 | Ilyes et al. |
| 2012/0147604 A1 | 6/2012 | Farmer |
| 2012/0147808 A1 | 6/2012 | Rhee |
| 2012/0153840 A1 | 6/2012 | Dahlen et al. |
| 2012/0161643 A1 | 6/2012 | Henig et al. |
| 2012/0176041 A1 | 7/2012 | Birru |
| 2012/0206050 A1 | 8/2012 | Spero |
| 2012/0223657 A1* | 9/2012 | Van de Ven ....... H05B 33/0827 315/297 |
| 2012/0229048 A1 | 9/2012 | Archer |
| 2012/0230696 A1 | 9/2012 | Pederson et al. |
| 2012/0235579 A1 | 9/2012 | Chemel et al. |
| 2012/0235600 A1 | 9/2012 | Simonian et al. |
| 2012/0242242 A1* | 9/2012 | Linz ................... H05B 33/0815 315/210 |
| 2012/0242254 A1 | 9/2012 | Kim et al. |
| 2012/0271477 A1 | 10/2012 | Okubo et al. |
| 2012/0299485 A1 | 11/2012 | Mohan et al. |
| 2012/0306375 A1 | 12/2012 | van de Ven |
| 2012/0306377 A1 | 12/2012 | Igaki et al. |
| 2013/0002157 A1* | 1/2013 | van de Ven ........ H05B 33/0824 315/192 |
| 2013/0002167 A1 | 1/2013 | Van de Ven |
| 2013/0013091 A1 | 1/2013 | Cavalcanti et al. |
| 2013/0026953 A1 | 1/2013 | Woytowitz |
| 2013/0049606 A1 | 2/2013 | Ferstl et al. |
| 2013/0051806 A1 | 2/2013 | Quilici et al. |
| 2013/0057395 A1 | 3/2013 | Ohashi |
| 2013/0058258 A1 | 3/2013 | Boesjes |
| 2013/0063042 A1 | 3/2013 | Bora et al. |
| 2013/0069539 A1 | 3/2013 | So |
| 2013/0075484 A1 | 3/2013 | Rhee et al. |
| 2013/0077299 A1 | 3/2013 | Hussell et al. |
| 2013/0088168 A1 | 4/2013 | Mohan et al. |
| 2013/0093328 A1 | 4/2013 | Ivey et al. |
| 2013/0154831 A1 | 6/2013 | Gray et al. |
| 2013/0155392 A1 | 6/2013 | Barrilleaux et al. |
| 2013/0155672 A1 | 6/2013 | Vo et al. |
| 2013/0200805 A1 | 8/2013 | Scapa et al. |
| 2013/0221857 A1* | 8/2013 | Bowers .............. H05B 33/0863 315/152 |
| 2013/0229784 A1 | 9/2013 | Lessard et al. |
| 2013/0320862 A1 | 12/2013 | Campbell et al. |
| 2013/0328486 A1 | 12/2013 | Jones |
| 2013/0342911 A1 | 12/2013 | Bartol et al. |
| 2014/0001952 A1 | 1/2014 | Harris et al. |
| 2014/0001959 A1 | 1/2014 | Motley et al. |
| 2014/0001962 A1 | 1/2014 | Harris |
| 2014/0001977 A1 | 1/2014 | Zacharchuk et al. |
| 2014/0062678 A1 | 3/2014 | de Clercq et al. |
| 2014/0167621 A1 | 6/2014 | Trott et al. |
| 2014/0167646 A1 | 6/2014 | Zukauskas et al. |
| 2014/0212090 A1 | 7/2014 | Wilcox et al. |
| 2014/0232299 A1 | 8/2014 | Wang |
| 2014/0268790 A1 | 9/2014 | Chobot et al. |
| 2014/0312777 A1 | 10/2014 | Shearer et al. |
| 2015/0008827 A1 | 1/2015 | Carrigan et al. |
| 2015/0008828 A1 | 1/2015 | Carrigan et al. |
| 2015/0008829 A1 | 1/2015 | Lurie et al. |
| 2015/0008831 A1 | 1/2015 | Carrigan et al. |
| 2015/0015145 A1 | 1/2015 | Carrigan et al. |
| 2015/0022096 A1 | 1/2015 | Deixler |
| 2015/0042243 A1 | 2/2015 | Picard |
| 2015/0048758 A1 | 2/2015 | Carrigan et al. |
| 2015/0160673 A1 | 6/2015 | Vasylyev |
| 2015/0195883 A1 | 7/2015 | Harris et al. |
| 2015/0264780 A1 | 9/2015 | Harris et al. |
| 2015/0345762 A1 | 12/2015 | Creasman et al. |
| 2015/0351187 A1 | 12/2015 | McBryde et al. |
| 2015/0351191 A1 | 12/2015 | Pope et al. |
| 2016/0029464 A1 | 1/2016 | Hughes et al. |

FOREIGN PATENT DOCUMENTS

| | | |
|---|---|---|
| AU | 2002219810 A8 | 5/2002 |
| AU | 2002352922 A1 | 6/2003 |
| CA | 2426769 A1 | 5/2002 |
| CA | 2511368 A1 | 5/2002 |
| CN | 101461151 A | 6/2009 |
| CN | 102119507 A | 7/2011 |
| DE | 60143707 D1 | 2/2011 |
| EP | 1330699 A1 | 7/2003 |
| EP | 1334608 A2 | 8/2003 |
| EP | 1461907 A1 | 9/2004 |
| EP | 1719363 A2 | 11/2006 |
| EP | 1886415 A2 | 2/2008 |
| EP | 2304311 A1 | 4/2011 |
| EP | 2327184 A1 | 6/2011 |
| EP | 2440017 A2 | 4/2012 |
| HK | 1114508 | 10/2008 |
| IN | 4576/KOLNP/2007 | 7/2008 |
| JP | H11345690 A | 12/1999 |
| JP | 2005510956 A | 4/2005 |
| JP | 3860116 B2 | 12/2006 |
| JP | 3896573 B2 | 3/2007 |
| JP | 2010198877 A | 9/2010 |
| JP | 2011526414 A | 10/2011 |
| KR | 20060050614 A | 5/2006 |
| KR | 20080025095 A | 3/2008 |
| WO | 0126068 A1 | 4/2001 |
| WO | 0126327 A2 | 4/2001 |
| WO | 0126328 A2 | 4/2001 |
| WO | 0126329 A2 | 4/2001 |
| WO | 0126331 A2 | 4/2001 |
| WO | 0126332 A2 | 4/2001 |
| WO | 0126333 A2 | 4/2001 |
| WO | 0126334 A2 | 4/2001 |
| WO | 0126335 A2 | 4/2001 |
| WO | 0126338 A2 | 4/2001 |
| WO | 0239242 A1 | 5/2002 |
| WO | 0241604 A2 | 5/2002 |
| WO | 03047175 A1 | 6/2003 |
| WO | 2004109966 A2 | 12/2004 |
| WO | 2006095316 A1 | 9/2006 |
| WO | 2006130662 A2 | 12/2006 |
| WO | 2007102097 A1 | 9/2007 |
| WO | 2009011898 A2 | 1/2009 |
| WO | 2009076492 A1 | 6/2009 |
| WO | 2009145747 A1 | 12/2009 |
| WO | 2009151416 A1 | 12/2009 |
| WO | 2009158514 A1 | 12/2009 |
| WO | 2010010493 A2 | 1/2010 |
| WO | 2010047971 A2 | 4/2010 |
| WO | 2010122457 A2 | 10/2010 |
| WO | 2011087681 A1 | 7/2011 |
| WO | 2011090938 A1 | 7/2011 |
| WO | 2011152968 A1 | 12/2011 |
| WO | 2012112813 A2 | 8/2012 |
| WO | 2012125502 A2 | 9/2012 |
| WO | 2013050970 A1 | 4/2013 |
| WO | 2014120971 A1 | 8/2014 |

OTHER PUBLICATIONS

Non-Final Office Action for U.S. Appl. No. 14/287,812, mailed Oct. 23, 2015, 9 pages.
Notice of Allowance for U.S. Appl. No. 13/782,022, mailed Apr. 27, 2015, 8 pages.
Notice of Allowance for U.S. Appl. No. 13/782,053, mailed Apr. 2, 2015, 8 pages.
Notice of Allowance for U.S. Appl. No. 29/452,813, mailed Mar. 18, 2015, 7 pages.
Supplemental Notice of Allowability for U.S. Appl. No. 29/452,813, mailed May 1, 2015, 4 pages.
Non-Final Office Action for U.S. Appl. No. 13/868,021, mailed Apr. 17, 2015, 10 pages.
Non-Final Office Action for U.S. Appl. No. 13/719,786, mailed Apr. 21, 2015, 13 pages.
International Search Report and Written Opinion for PCT/US2015/010050, mailed Mar. 24, 2015, 10 pages.

(56) References Cited

OTHER PUBLICATIONS

Notice of Allowance for U.S. Appl. No. 13/782,022, mailed Jul. 22, 2015, 8 pages.
International Preliminary Report on Patentability for PCT/US2013/075723, mailed Jul. 2, 2015, 6 pages.
International Preliminary Report on Patentability for PCT/US2013/075729, mailed Jul. 2, 2015, 6 pages.
Notice of Allowance for U.S. Appl. No. 13/782,053, mailed Jul. 17, 2015, 8 pages.
International Preliminary Report on Patentability for PCT/US2013/075737, mailed Jul. 2, 2015, 7 pages.
International Preliminary Report on Patentability for PCT/US2013/075742, mailed Jul. 2, 2015, 7 pages.
International Preliminary Report on Patentability for PCT/US2013/075748, mailed Jul. 2, 2015, 5 pages.
International Preliminary Report on Patentability for PCT/US2013/075754, mailed Jul. 2, 2015, 5 pages.
International Preliminary Report on Patentability for PCT/US2013/075761, mailed Jul. 2, 2015, 5 pages.
Notice of Allowance for U.S. Appl. No. 29/452,813, mailed Sep. 3, 2015, 7 pages.
Final Office Action for U.S. Appl. No. 13/868,021, mailed Jul. 23, 2015, 11 pages.
Non-Final Office Action for U.S. Appl. No. 13/719,786, mailed Sep. 18, 2015, 16 pages.
International Preliminary Report on Patentability for PCT/US2013/075777, mailed Jul. 2, 2015, 10 pages.
International Search Report and Written Opinion for PCT/US2015/032431, mailed Jul. 24, 2015, 11 pages.
Author Unknown, "Cluster Analysis", Wikipedia—the free encyclopedia, Updated May 21, 2013, Retrieved on May 30, 2013, http://en.wikipedia.org/wiki/cluster_analysis, 16 pages.
Author Unknown, "IEEE Standard for Information Technology—Telecommunications and Information Exchange Between Systems—Local and Metropolitan Area Networks—Specific Requirements—Part 3: Carrier Sense Multiple Access with Collision Detection (CSMA/CD) Access Method and Physical Layer Specifications—Amendment: Data Terminal Equipment (DTE) Power Via Media Dependent Interface (MDI)," Standard 802.3af-2003, Jun. 18, 2003, The Institute of Electrical and Electronics Engineers, Inc., 133 pages.
Author Unknown, "IEEE Standard for Information Technology—Telecommunications and Information Exchange Between Systems—Local and Metropolitan Area Networks—Specific Requirements—Part 3: Carrier Sense Multiple Access with Collision Detection (CSMA/CD) Access Method and Physical Layer Specifications—Amendment 3: Data Terminal Equipment (DTE) Power via the Media Dependent Interface (MDI) Enhancements," Standard 802.3at—2009, Sep. 11, 2009, The Institute of Electrical and Electronics Engineers, Inc., 141 pages.
Author Unknown, "Multi-Agent System", Wikipedia—the free encyclopedia, Updated Apr. 18, 2013, Retrieved May 30, 2013, http://en.wikipedia.org/wiki/multi-agent_system, 7 pages.
Author Unknown, i2C-Bus: What's That?, Updated 2012, Retrieved May 30, 2013, http://www.i2c-bus.org, 1 page.
Kuhn, Fabian et al., "Initializing Newly Deployed Ad Hoc & Sensor Network", The Tenth Annual International Conference on Mobile Computing and Networking (MobiCom '04), Sep. 26-Oct. 4, 2004, 15 pages, Philadelphia, PA.
Teasdale, Dana et al., "Annual Technical Progress Report: Adapting Wireless Technology to Lighting Control and Environmental Sensing," Dust Networks, Aug. 1, 2004, 41 pages.
Non-Final Office Action for U.S. Appl. No. 13/782,022, mailed Nov. 14, 2014, 14 pages.
International Search Report and Written Opinion for PCT/US2013/075723, mailed May 9, 2014, 8 pages.
Non-Final Office Action for U.S. Appl. No. 13/782,040, mailed May 8, 2013, 10 pages.
Final Office Action for U.S. Appl. No. 13/782,040, mailed Oct. 18, 2013, 16 pages.
Non-Final Office Action for U.S. Appl. No. 13/782,040, mailed Feb. 11, 2014, 10 pages.
Notice of Allowance for U.S. Appl. No. 13/782,040 mailed Jul. 23, 2014, 8 pages.
Notice of Allowance for U.S. Appl. No. 13/782,040 mailed Nov. 17, 2014, 8 pages.
International Search Report and Written Opinion for International Application PCT/US2013/075729, mailed Apr. 29, 2014, 8 pages.
Non-Final Office Action for U.S. Appl. No. 13/782,053, mailed Nov. 14, 2014, 11 pages.
Invitation to Pay Additional Fees and Partial International Search for PCT/US2013/075737, mailed May 13, 2014, 5 pages.
International Search Report and Written Opinion for PCT/US2013/075737, mailed Aug. 27, 2014, 11 pages.
Non-Final Office Action for U.S. Appl. No. 13/782,068, mailed Jul. 16, 2013, 6 pages.
Notice of Allowance for U.S. Appl. No. 13/782,068, mailed Oct. 22, 2013, 9 pages.
Non-Final Office Action for U.S. Appl. No. 13/782,068, mailed Nov. 15, 2013, 5 pages.
Final Office Action for U.S. Appl. No. 13/782,068, mailed Mar. 7, 2014, 7 pages.
Notice of Allowance for U.S. Appl. No. 13/782,068, mailed May 12, 2014, 7 pages.
Non-Final Office Action for U.S. Appl. No. 13/782,068, mailed Aug. 15, 2014, 6 pages.
Invitation to Pay Additional Fees and Partial International Search for PCT/US2013/075742, mailed May 14, 2014, 6 pages.
International Search Report and Written Opinion for PCT/US2013/075742, mailed Aug. 27, 2014, 11 pages.
Quayle Action for U.S. Appl. No. 13/782,078, mailed Jun. 12, 2013, 4 pages.
Notice of Allowance for U.S. Appl. No. 13/782,078, mailed Sep. 16, 2013, 7 pages.
Supplemental Notice of Allowability for U.S. Appl. No. 13/782,078, mailed Sep. 27, 2013, 2 pages.
International Search Report and Written Opinion for PCT/US2013/075748, mailed May 9, 2014, 7 pages.
Non-Final Office Action for U.S. Appl. No. 13/782,096, mailed Jun. 10, 2013, 12 pages.
Final Office Action for U.S. Appl. No. 13/782,096, mailed Nov. 18, 2013, 15 pages.
Advisory Action for U.S. Appl. No. 13/782,096, mailed Jan. 27, 2014, 3 pages.
Examiner's Answer to the Appeal Brief for U.S. Appl. No. 13/782,096, mailed Jul. 7, 2014, 17 pages.
International Search Report and Written Opinion for PCT/US2013/075754, mailed May 15, 2014, 8 pages.
Non-Final Office Action for U.S. Appl. No. 13/782,131, mailed May 28, 2013, 10 pages.
Non-Final Office Action for U.S. Appl. No. 13/782,131, mailed Nov. 6, 2013, 8 pages.
Notice of Allowance for U.S. Appl. No. 13/782,131, mailed Feb. 20, 2014, 9 pages.
Notice of Allowance for U.S. Appl. No. 13/782,131, mailed Jun. 5, 2014, 5 pages.
Notice of Allowance for U.S. Appl. No. 13/782,131, mailed Oct. 28, 2014, 5 pages.
International Search Report and Written Opinion for PCT/US2013/075761, mailed May 15, 2014, 7 pages.
Requirement for Restriction/Election for U.S. Appl. No. 29/452,813, mailed Nov. 21, 2014, 6 pages.
Non-Final Office Action for U.S. Appl. No. 13/719,786, mailed Mar. 6, 2014, 12 pages.
Final Office Action for U.S. Appl. No. 13/719,786, mailed Jul. 29, 2014, 14 pages.
Non-Final Office Action for U.S. Appl. No. 13/719,786, mailed Nov. 20, 2014, 16 pages.
Invitation to Pay Additional Fees and Partial International Search Report for PCT/US2013/075777, mailed Jun. 5, 2014, 6 pages.
International Search Report and Written Opinion for PCT/US2013/075777, mailed Aug. 12, 2014, 14 pages.

(56) References Cited

OTHER PUBLICATIONS

Non-Final Office Action for U.S. Appl. No. 14/292,286, mailed Nov. 19, 2015, 16 pages.
Non-Final Office Action for U.S. Appl. No. 14/292,363, mailed Nov. 19, 2015, 9 pages.
Applicant-Initiated Interview Summary for U.S. Appl. No. 14/287,812, mailed Jan. 5, 2016, 4 pages.
Examination Report for European Patent Application No. 13818895.8, mailed Mar. 11, 2016, 3 pages.
Final Office Action for U.S. Appl. No. 14/292,286, mailed Apr. 14, 2016, 16 pages.
Notice of Allowance for U.S. Appl. No. 14/292,363, mailed Apr. 4, 2016, 7 pages.
Non-Final Office Action for U.S. Appl. No. 14/498,168, mailed Mar. 29, 2016, 15 pages.
Non-Final Office Action for U.S. Appl. No. 14/498,119, mailed Mar. 18, 2016, 21 pages.
Non-Final Office Action for U.S. Appl. No. 14/498,219, mailed Apr. 15, 2016, 17 pages.
Non-Final Office Action for U.S. Appl. No. 14/498,197, mailed Apr. 26, 2016, 21 pages.
Notice of Allowance for U.S. Appl. No. 14/681,846, mailed Apr. 19, 2016, 7 pages.
Examination and Search Report for European Patent Application No. 13821549.6, mailed Aug. 24, 2016, 7 pages.
Notice of Allowance for U.S. Appl. No. 14/292,363, mailed Jul. 21, 2016, 8 pages.
Final Office Action for U.S. Appl. No. 14/498,168, mailed Jul. 27, 2016, 14 pages.
Final Office Action for U.S. Appl. No. 14/498,119, mailed Aug. 16, 2016, 15 pages.
International Preliminary Report on Patentability for PCT/US2015/010050, mailed Jul. 21, 2016, 7 pages.
Final Office Action for U.S. Appl. No. 14/498,197, mailed Aug. 11, 2016, 22 pages.
Final Office Action for U.S. Appl. No. 14/498,219, mailed Jul. 27, 2016, 13 pages.
Examination Report for European Patent Application No. 13814809.3, mailed Apr. 29, 2016, 5 pages.
First Office Action for Chinese Patent Application 201380073247.X, mailed May 17, 2016, 18 pages.
Examination Report for European Patent Application No. 13814810.1, mailed May 24, 2016, 4 pages.
Communication under Rule 164(2)(a) EPC for European Patent Application No. 13821549.6, mailed May 2, 2016, 4 pages.
Examination Report for European Patent Application No. 13821550.4, mailed May 2, 2016, 4 pages.
Examination Report for European Patent Application No. 13821552.0, mailed May 2, 2016, 4 pages.
International Search Report for International Patent Application No. PCT/US2016/024426, mailed Jun. 23, 2016, 11 pages.
Notice of Allowance for U.S. Appl. No. 13/782,068, mailed Jun. 3, 2016, 7 pages.
Non-Final Office Action for U.S. Appl. No. 13/868,021, mailed Jun. 27, 2016, 9 pages.
Final Office Action for U.S. Appl. No. 13/719,786, mailed Apr. 28, 2016, 19 pages.
Non-Final Office Action for U.S. Appl. No. 14/588,762, mailed Jun. 23, 2016, 12 pages.
Non-Final Office Action for U.S. Appl. No. 14/725,687, mailed Jun. 30, 2016, 18 pages.
Advisory Action for U.S. Appl. No. 14/292,286, mailed Jun. 20, 2016, 3 pages.
Final Office Action for U.S. Appl. No. 14/287,812, mailed May 6, 2016, 11 pages.
Non-Final Office Action for U.S. Appl. No. 14/498,147, mailed May 24, 2016, 15 pages.
Decision on Appeal for U.S. Appl. No. 13/782,096, mailed Jul. 8, 2016, 14 pages.
Advisory Action for U.S. Appl. No. 14/292,332, mailed Jul. 14, 2016, 3 pages.
Advisory Action for U.S. Appl. No. 14/287,812, mailed Jul. 14, 2016, 3 pages.
Notice of Allowance for U.S. Appl. No. 13/782,096, mailed Sep. 26, 2016, 10 pages.
Advisory Action for U.S. Appl. No. 13/719,786, mailed Sep. 6, 2016, 3 pages.
First Office Action for Chinese Patent Application No. 201380073345.3, issued Aug. 3, 2016, 23 pages.
Non-Final Office Action for U.S. Appl. No. 14/292,286, mailed Oct. 6, 2016, 15 pages.
Non-Final Office Action for U.S. Appl. No. 14/287,812, mailed Sep. 27, 2016, 13 pages.
Final Office Action for U.S. Appl. No. 14/498,147, mailed Sep. 8, 2016, 14 pages.
Examination Report for European Patent Application No. 13814809.3, mailed Oct. 14, 2016, 5 pages.
Examination Report for European Patent Application No. 13814810.1, mailed Oct. 14, 2016, 4 pages.
Final Office Action for U.S. Appl. No. 13/868,021, mailed Nov. 25, 2016, 11 pages.
Non-Final Office Action for U.S. Appl. No. 13/719,786, mailed Nov. 28, 2016, 6 pages.
Final Office Action for U.S. Appl. No. 14/588,762, mailed Dec. 30, 2016, 18 pages.
Notice of Allowance for U.S. Appl. No. 14/292,363, mailed Nov. 4, 2016, 8 pages.
Advisory Action and Examiner-Initiated Interview Summary for U.S. Appl. No. 14/498,168, mailed Dec. 8, 2016, 5 pages.
Advisory Action and Examiner-Initiated Interview Summary for U.S. Appl. No. 14/498,119, mailed Dec. 8, 2016, 5 pages.
Advisory Action and Examiner-Initiated Interview Summary for U.S. Appl. No. 14/498,147, mailed Nov. 29, 2016, 4 pages.
Advisory Action and Examiner-Initiated Interview Summary for U.S. Appl. No. 14/498,197, mailed Dec. 8, 2016, 4 pages.
Advisory Action and Examiner-Initiated Interview Summary for U.S. Appl. No. 14/498,219, mailed Dec. 8, 2016, 4 pages.
Final Office Action for U.S. Appl. No. 14/725,687, mailed Nov. 1, 2016, 14 pages.
English Translation of Notice of Reason(s) for Rejection for Japanese Patent Application No. 2015-549572, mailed Oct. 18, 2016, 5 pages.
International Preliminary Report on Patentability for PCT/US2015/032431, mailed Dec. 15, 2016, 9 pages.
Second Office Action for Chinese Patent Application No. 201380073247.X, mailed Dec. 21, 2016, 14 pages.
Examination Report for European Patent Application No. 13821550.4, mailed Feb. 13, 2017, 5 pages.
Second Office Action for Chinese Patent Application No. 201380073345.3, issued Dec. 30, 2016, 16 pages.
Digeronimo, John, "Search Report," EIC 2800, Tracking No. 533769, Scientific & Technical Information Center, Feb. 1, 2017, 16 pages.
Advisory Action for U.S. Appl. No. 13/868,021, mailed Jan. 31, 2017, 2 pages.
Non-Final Office Action for U.S. Appl. No. 13/868,021, mailed Mar. 3, 2017, 18 pages.
Advisory Action and Applicant-Initiated Interview Summary for U.S. Appl. No. 14/588,762, mailed Mar. 8, 2017, 6 pages.
Advisory Action for U.S. Appl. No. 14/725,687, mailed Feb. 15, 2017, 3 pages.
Non-Final Office Action for U.S. Appl. No. 14/498,168, mailed Feb. 9, 2017, 15 pages.
Notice of Allowance and Examiner-Initiated Interview Summary for U.S. Appl. No. 14/498,119, mailed Jan. 23, 2017, 10 pages.
Notice of Allowance and Examiner-Initiated Interview Summary for U.S. Appl. No. 14/498,147, mailed Mar. 2, 2017, 11 pages.
Notice of Allowance for U.S. Appl. No. 14/498,197, mailed Feb. 10, 2017, 9 pages.
Notice of Allowance and Examiner-Initiated Interview Summary for U.S. Appl. No. 14/498,219, mailed Feb. 16, 2017, 13 pages.

(56) References Cited

OTHER PUBLICATIONS

Examination Report for European Patent Application No. 13814809.3, mailed Apr. 7, 2017, 4 pages.
Notice of Reasons for Rejection for Japanese Patent Application No. 2015-549572, mailed Apr. 25, 2017, 3 pages.
Examination Report for European Patent Application No. 13814810.1, mailed Mar. 31, 2017, 6 pages.
Examination Report for European Patent Application No. 13821549.6, mailed Apr. 6, 2017, 4 pages.
Examination Report for European Patent Application No. 15700917.6, mailed Apr. 20, 2017, 5 pages.
Final Office Action for U.S. Appl. No. 13/719,786, mailed Apr. 19, 2017, 7 pages.
Non-Final Office Action for U.S. Appl. No. 14/588,762, mailed Apr. 6, 2017, 13 pages.
Non-Final Office Action for U.S. Appl. No. 14/725,687, mailed Apr. 6, 2017, 16 pages.
Final Office Action for U.S. Appl. No. 14/292,286, mailed Mar. 27, 2017, 17 pages.
Final Office Action for U.S. Appl. No. 14/287,812, mailed Apr. 20, 2017, 12 pages.

* cited by examiner

DIGITALLY CONTROLLED DRIVER FOR LIGHTING FIXTURE

CROSS-REFERENCE TO RELATED APPLICATIONS

This application is related to concurrently filed U.S. patent application Ser. No. 14/292,286 filed on May 30, 2014, entitled LIGHTING FIXTURE PROVIDING VARIABLE CCT and concurrently filed U.S. Pat. No. 9,549,448 issued on Jan. 17, 2017, entitled WALL CONTROLLER CONTROLLING CCT, the disclosures of which are incorporated herein by reference in their entireties.

FIELD OF THE DISCLOSURE

The present disclosure relates to lighting fixtures and controls therefor, and in particular to controlling the color temperature of lighting fixtures.

BACKGROUND

In recent years, a movement has gained traction to replace incandescent light bulbs with lighting fixtures that employ more efficient lighting technologies as well as to replace relatively efficient fluorescent lighting fixtures with lighting technologies that produce a more pleasing, natural light. One such technology that shows tremendous promise employs light emitting diodes (LEDs). Compared with incandescent bulbs, LED-based light fixtures are much more efficient at converting electrical energy into light, are longer lasting, and are also capable of producing light that is very natural. Compared with fluorescent lighting, LED-based fixtures are also very efficient, but are capable of producing light that is much more natural and more capable of accurately rendering colors. As a result, lighting fixtures that employ LED technologies are replacing incandescent and fluorescent bulbs in residential, commercial, and industrial applications.

Unlike incandescent bulbs that operate by subjecting a filament to a desired current, LED-based lighting fixtures require electronics to drive one or more LEDs. The electronics generally include a power supply and special control circuitry to provide uniquely configured signals that are required to drive the one or more LEDs in a desired fashion. The presence of the control circuitry adds a potentially significant level of intelligence to the lighting fixtures that can be leveraged to employ various types of lighting control. Such lighting control may be based on various environmental conditions, such as ambient light, occupancy, temperature, and the like.

SUMMARY

The present disclosure relates to a lighting fixture that is capable of providing white light over an extended range of correlated color temperatures. In one embodiment, the lighting fixture includes a driver module and a number of LED strings. Each of the LED strings emits light at a different color point. The driver module may be configured to:
- store a current model for each string, wherein each current model effectively defines current as a function of CCT over a CCT range;
- determine a desired CCT; and
- generate a current for each string based on the desired CCT using the corresponding current model.

As such, the light from each string mixes to form white light with a color point that falls along a black body locus at the desired CCT.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

Figure 1:
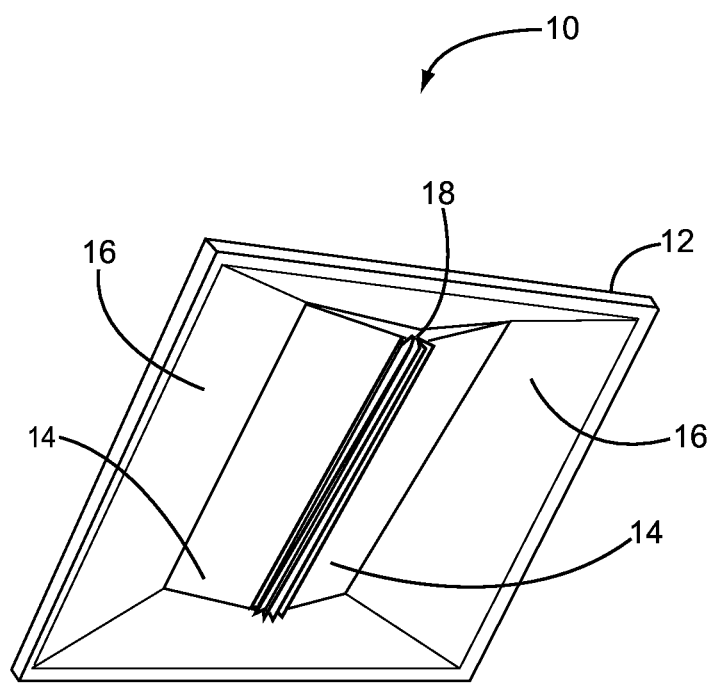
FIG. 1 is a perspective view of a troffer-based lighting fixture according to one embodiment of the disclosure.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that relative terms such as "front," "forward," "rear," "below," "above," "upper," "lower," "horizontal," or "vertical" may be used herein to describe a relationship of one element, layer or region to another element, layer or region as illustrated in the figures. It will be understood that these terms are intended to encompass different orientations of the device in addition to the orientation depicted in the figures.

The present disclosure relates to a lighting fixture that is capable of providing white light over an extended range of correlated color temperatures. In one embodiment, the lighting fixture includes a driver module and a number of LED strings. Each of the LED strings emits light at a different color point. The driver module may be configured to:

store a current model for each string, wherein each current model effectively defines current as a function of CCT over a CCT range;

determine a desired CCT; and generate a current for each string based on the desired CCT using the corresponding current model.

As such, the light from each string mixes to form white light with a color point that falls along a black body locus at the desired CCT.

Prior to delving into the details of the present disclosure, an overview of an exemplary lighting fixture is provided. While the concepts of the present disclosure may be employed in any type of lighting system, the immediately following description describes these concepts in a troffer-type lighting fixture, such as the lighting fixture 10 illustrated in FIGS. 1-3. This particular lighting fixture is substantially similar to the CR and CS series of troffer-type lighting fixtures that are manufactured by Cree, Inc. of Durham, N.C.

While the disclosed lighting fixture 10 employs an indirect lighting configuration wherein light is initially emitted upward from a light source and then reflected downward, direct lighting configurations may also take advantage of the concepts of the present disclosure. In addition to troffer-type lighting fixtures, the concepts of the present disclosure may also be employed in recessed lighting configurations, wall mount lighting configurations, outdoor lighting configurations, and the like. Reference is made to co-pending and co-assigned U.S. patent application Ser. No. 13/589,899 filed Aug. 20, 2013, and Ser. No. 13/649,531 filed Oct. 11, 2012, and co-assigned U.S. Pat. No. 8,829,800 issued Sep. 9, 2014, the contents of which are incorporated herein by reference in their entireties. Further, the functionality and control techniques described below may be used to control different types of lighting fixtures, as well as different groups of the same or different types of lighting fixtures at the same time.

Figure 2:
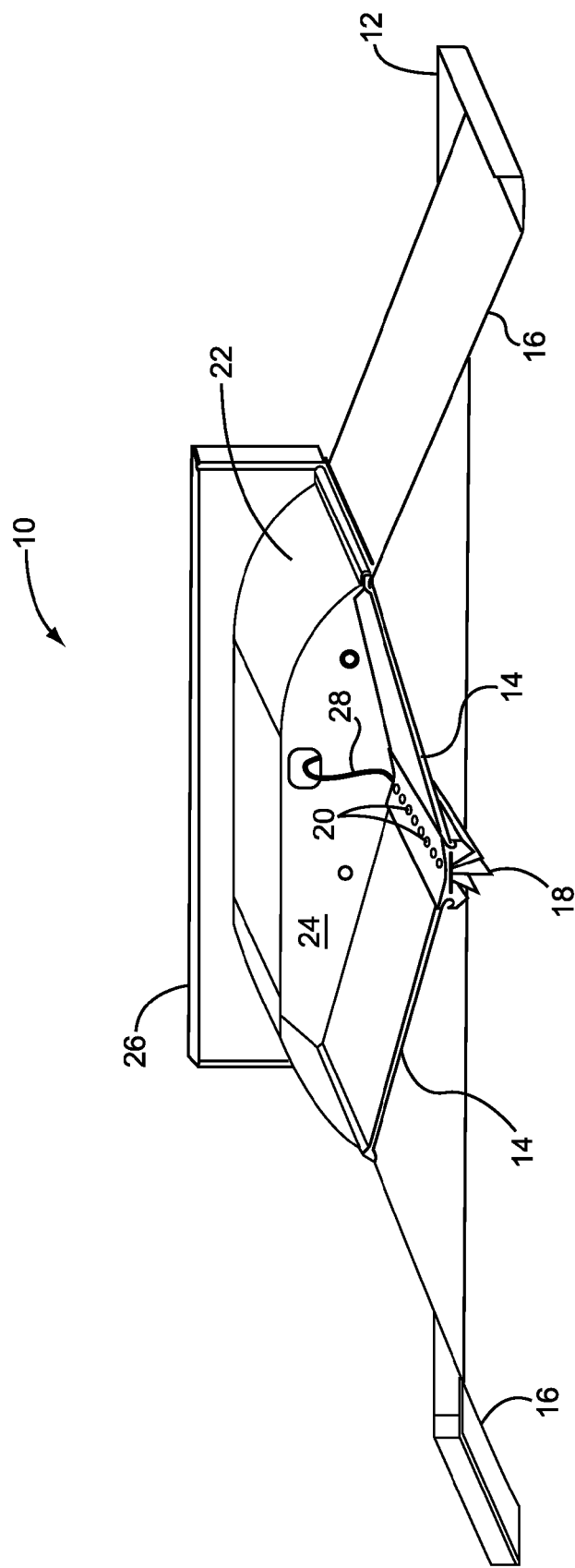
FIG. 2 is a cross section of the lighting fixture of FIG. 1.
Figure 3:
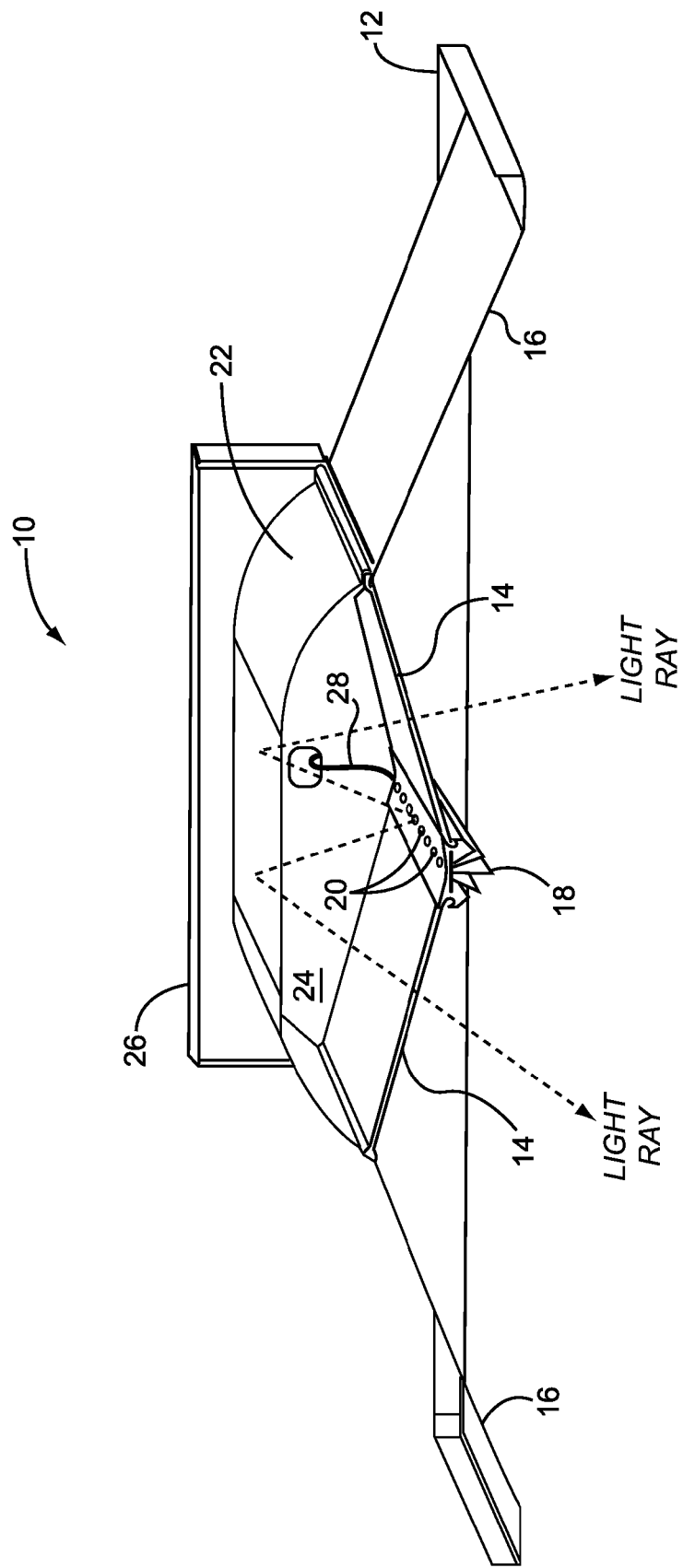
FIG. 3 is a cross section of the lighting fixture of FIG. 1 illustrating how light emanates from the LEDs of the lighting fixture and is reflected out through lenses of the lighting fixture.

In general, troffer-type lighting fixtures, such as the lighting fixture 10, are designed to mount in, on, or from a ceiling. In most applications, the troffer-type lighting fixtures are mounted into a drop ceiling (not shown) of a commercial, educational, or governmental facility. As illustrated in FIGS. 1-3, the lighting fixture 10 includes a square or rectangular outer frame 12. In the central portion of the lighting fixture 10 are two rectangular lenses 14, which are generally transparent, translucent, or opaque. Reflectors 16 extend from the outer frame 12 to the outer edges of the lenses 14. The lenses 14 effectively extend between the innermost portions of the reflectors 16 to an elongated heatsink 18, which functions to join the two inside edges of the lenses 14.

Turning now to FIGS. 2 and 3 in particular, the back side of the heatsink 18 provides a mounting structure for an LED array 20, which includes one or more rows of individual LEDs mounted on an appropriate substrate. The LEDs are oriented to primarily emit light upwards toward a concave cover 22. The volume bounded by the cover 22, the lenses 14, and the back of the heatsink 18 provides a mixing chamber 24. As such, light will emanate upwards from the LEDs of the LED array 20 toward the cover 22 and will be reflected downward through the respective lenses 14, as illustrated in FIG. 3. Notably, not all light rays emitted from the LEDs will reflect directly off of the bottom of the cover 22 and back through a particular lens 14 with a single reflection. Many of the light rays will bounce around within the mixing chamber 24 and effectively mix with other light rays, such that a desirably uniform light is emitted through the respective lenses 14.

Those skilled in the art will recognize that the type of lenses 14, the type of LEDs, the shape of the cover 22, and any coating on the bottom side of the cover 22, among many other variables, will affect the quantity and quality of light emitted by the lighting fixture 10. As will be discussed in greater detail below, the LED array 20 may include LEDs of different colors, wherein the light emitted from the various LEDs mixes together to form a white light having a desired color temperature and quality based on the design parameters for the particular embodiment.

As is apparent from FIGS. 2 and 3, the elongated fins of the heatsink 18 may be visible from the bottom of the lighting fixture 10. Placing the LEDs of the LED array 20 in thermal contact along the upper side of the heatsink 18 allows any heat generated by the LEDs to be effectively transferred to the elongated fins on the bottom side of the heatsink 18 for dissipation within the room in which the lighting fixture 10 is mounted. Again, the particular configuration of the lighting fixture 10 illustrated in FIGS. 1-3 is merely one of the virtually limitless configurations for lighting fixtures 10 in which the concepts of the present disclosure are applicable.

Figure 4:
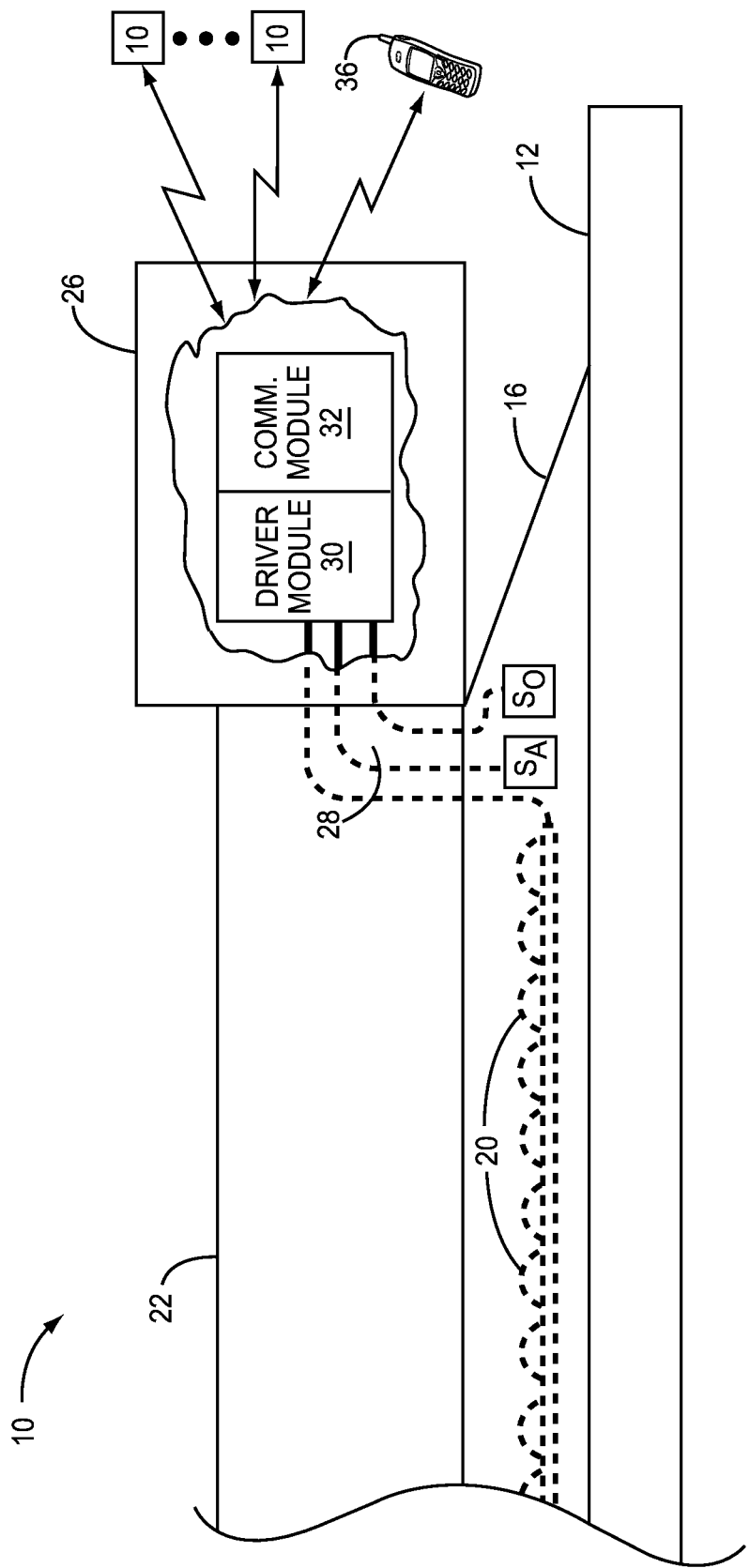
FIG. 4 illustrates a driver module and a communications module integrated within an electronics housing of the lighting fixture of FIG. 1.

With continued reference to FIGS. 2 and 3, an electronics housing 26 is shown mounted at one end of the lighting fixture 10, and is used to house all or a portion of the electronics used to power and control the LED array 20. These electronics are coupled to the LED array 20 through appropriate cabling 28. With reference to FIG. 4, the electronics provided in the electronics housing 26 may be divided into a driver module 30 and a communications module 32.

At a high level, the driver module 30 is coupled to the LED array 20 through the cabling 28 and directly drives the LEDs of the LED array 20 based on control information provided by the communications module 32. In one embodiment, the driver module 30 provides the primary intelligence for the lighting fixture 10 and is capable of driving the LEDs of the LED array 20 in a desired fashion. The driver module 30 may be provided on a single, integrated module or divided into two or more sub-modules depending the desires of the designer.

When the driver module provides the primary intelligence for the lighting fixture 10, the communications module 32 acts as an intelligent communication interface that facilitates communications between the driver module 30 and other lighting fixtures 10, a remote control system (not shown), or a portable handheld commissioning tool 36, which may also be configured to communicate with a remote control system in a wired or wireless fashion.

Alternatively, the driver module 30 may be primarily configured to drive the LEDs of the LED array 20 based on instructions from the communications module 32. In such an embodiment, the primary intelligence of the lighting fixture 10 is provided in the communications module 32, which effectively becomes an overall control module with wired or wireless communication capability, for the lighting fixture 10. The lighting fixture 10 may share sensor data, instructions, and any other data with other lighting fixtures 10 in the lighting network or with remote entities. In essence, the communications module 32 facilitates the sharing of intelligence and data among the lighting fixtures 10 and other entities.

In the embodiment of FIG. 4, the communications module 32 may be implemented on a separate printed circuit board (PCB) than the driver module 30. The respective PCBs of the driver module 30 and the communications module 32 may be configured to allow the connector of the communications module 32 to plug into the connector of the driver module 30, wherein the communications module 32 is mechanically mounted, or affixed, to the driver module 30 once the connector of the communications module 32 is plugged into the mating connector of the driver module 30.

In other embodiments, a cable may be used to connect the respective connectors of the driver module 30 and the communications module 32, other attachment mechanisms may be used to physically couple the communications module 32 to the driver module 30, or the driver module 30 and the communications module 32 may be separately affixed to the inside of the electronics housing 26. In such embodiments, the interior of the electronics housing 26 is sized appropriately to accommodate both the driver module 30 and the communications module 32. In many instances, the electronics housing 26 provides a plenum rated enclosure for both the driver module 30 and the communications module 32.

Figure 5:
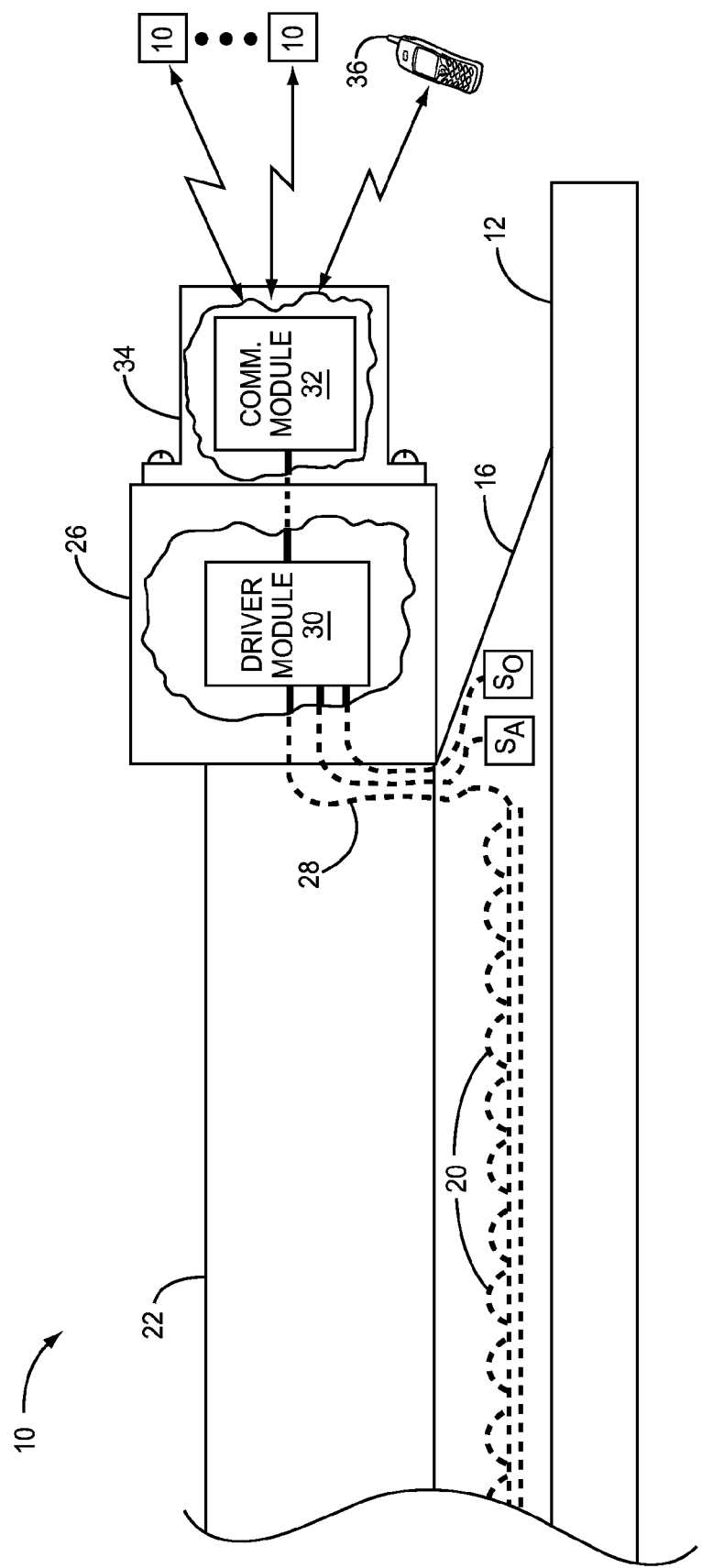
FIG. 5 illustrates a driver module provided in an electronics housing of the lighting fixture of FIG. 1 and a communications module in an associated housing coupled to the exterior of the electronics housing according to one embodiment of the disclosure.

With the embodiment of FIG. 4, adding or replacing the communications module 32 requires gaining access to the interior of the electronics housing 26. If this is undesirable, the driver module 30 may be provided alone in the electronics housing 26. The communications module 32 may be mounted outside of the electronics housing 26 in an exposed fashion or within a supplemental housing 34, which may be directly or indirectly coupled to the outside of the electronics housing 26, as shown in FIG. 5. The supplemental housing 34 may be bolted to the electronics housing 26. The supplemental housing 34 may alternatively be connected to the electronics housing using snap-fit or hook-and-snap mechanisms. The supplemental housing 34, alone or when coupled to the exterior surface of the electronics housing 26, may provide a plenum rated enclosure.

In embodiments where the electronics housing 26 and the supplemental housing 34 will be mounted within a plenum rated enclosure, the supplemental housing 34 may not need to be plenum rated. Further, the communications module 32 may be directly mounted to the exterior of the electronics housing 26 without any need for a supplemental housing 34, depending on the nature of the electronics provided in the communications module 32, how and where the lighting fixture 10 will be mounted, and the like.

The latter embodiment wherein the communications module 32 is mounted outside of the electronics housing 26 may prove beneficial when the communications module 32 facilitates wireless communications with the other lighting fixtures 10, the remote control system, or other network or auxiliary device. In essence, the driver module 30 may be provided in the plenum rated electronics housing 26, which may not be conducive to wireless communications. The communications module 32 may be mounted outside of the electronics housing 26 by itself or within the supplemental housing 34 that is more conducive to wireless communications. A cable may be provided between the driver module 30 and the communications module 32 according to a defined communication interface. As an alternative, which is described in detail further below, the driver module 30 may be equipped with a first connector that is accessible through the wall of the electronics housing 26. The communications module 32 may have a second connector, which mates with the first connector to facilitate communications between the driver module 30 and the communications module 32.

The embodiments that employ mounting the communications module 32 outside of the electronics housing 26 may be somewhat less cost effective, but provide significant flexibility in allowing the communications module 32 or other auxiliary devices to be added to the lighting fixture 10, serviced, or replaced. The supplemental housing 34 for the communications module 32 may be made of a plenum rated plastic or metal, and may be configured to readily mount to the electronics housing 26 through snaps, screws, bolts, or the like, as well as receive the communications module 32. The communications module 32 may be mounted to the inside of the supplemental housing 34 through snap-fits, screws, twistlocks, and the like. The cabling and connectors used for connecting the communications module 32 to the driver module 30 may take any available form, such as with standard category 5/6 (cat 5/6) cable having RJ45 connectors, edge card connectors, blind mate connector pairs, terminal blocks and individual wires, and the like. Having an externally mounted communications module 32 relative to the electronics housing 26 that includes the driver module 30 allows for easy field installation of different types of communications modules 32 or modules with other functionality for a given driver module 30.

As illustrated in FIG. 5, the communications module 32 is mounted within the supplemental housing 34. The supplemental housing 34 is attached to the electronics housing 26 with bolts. As such, the communications module 32 is readily attached and removed via the illustrated bolts. Thus, a screwdriver, ratchet, or wrench, depending on the type of head for the bolts, is required to detach or remove the communications module 32 via the supplemental housing 34.

Figure 6A:
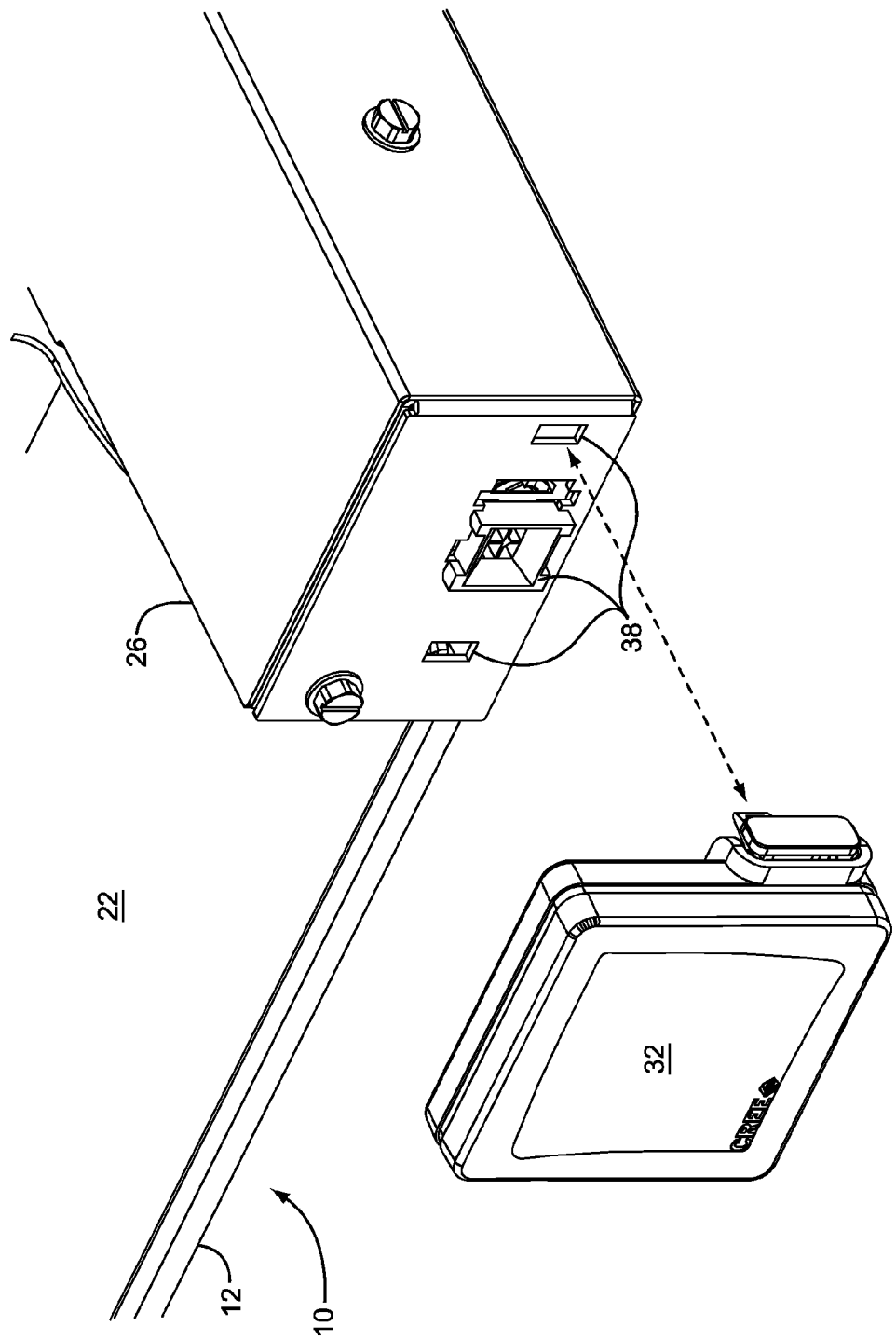
FIGS. 6A and 6B respectively illustrate a communications module according to one embodiment, before and after being attached to the housing of the lighting fixture.
Figure 6B:
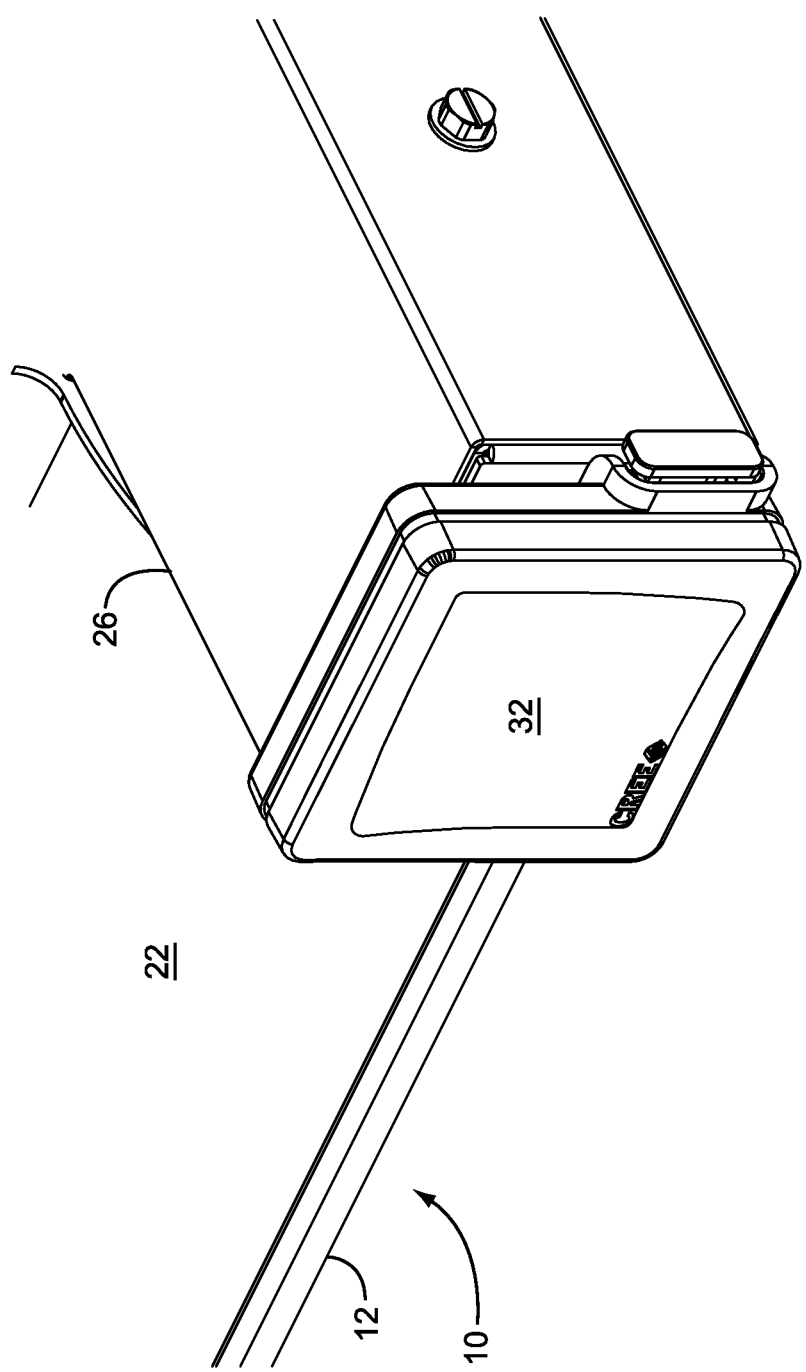

As an alternative, the communications module 32 may be configured as illustrated in FIGS. 6A and 6B. In this configuration, the communications module 32 may be attached to the electronics housing 26 of the lighting fixture 10 in a secure fashion and may subsequently be released from the electronics housing 26 without the need for bolts using available snap-lock connectors, such as illustrated in U.S. patent application Ser. No. 13/868,021, which was previously incorporated by reference. Notably, the rear of the communication module housing includes a male (or female) snap-lock connector (not shown), which is configured to securely and releasable engage a complementary female (or male) snap-lock connector 38 on the electronics housing 26.

FIG. 6A illustrates the communications module 32 prior to being attached to or just after being released from the electronics housing 26 of the lighting fixture 10. One surface of the electronics housing 26 of the lighting fixture 10 includes the snap-lock connector 38, which includes a female electrical connector that is flanked by openings that extend into the electronics housing 26 of the lighting fixture 10. The openings correspond in size and location to the locking members (not shown) on the back of the communications module 32. Further, the female electrical connector leads to or is coupled to a PCB of the electronics for the driver module 30. In this example, the male electrical connector of the communications module 32 is configured to engage the female electrical connector, which is mounted in the electronics housing 26 of the lighting fixture 10.

As the communications module 32 is snapped into place on the electronics housing 26 of the lighting fixture 10, as illustrated in FIG. 6B, the male electrical connector of the communications module 32 will engage the female electrical connector of the driver module 30 as the fixture locking members of the communications module 32 engage the respective openings of the locking interfaces in the electronics housing 26. At this point, the communications module 32 is snapped into place to the electronics housing 26 of the lighting fixture 10, and the respective male and female connectors of the communications module 32 and the driver module 30 are fully engaged.

Figure 7:
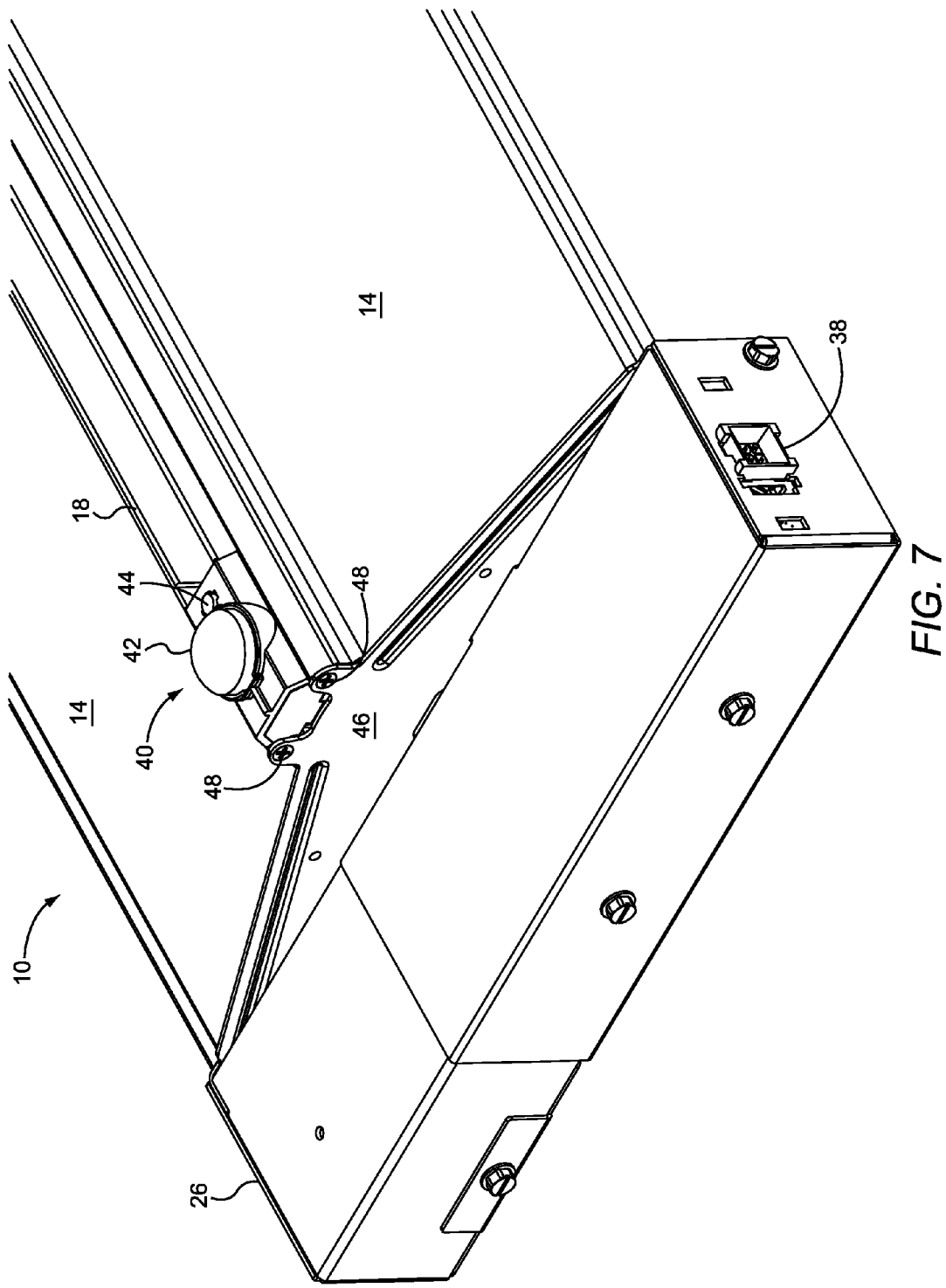
FIG. 7 illustrates a sensor module installed in a heatsink of a lighting fixture according to one embodiment of the disclosure.

With reference to FIG. 7, the bottom of one embodiment of the lighting fixture 10 is illustrated in a perspective view. In this embodiment, a sensor module 40 is shown integrated into exposed side of the heatsink 18 at one end of the heatsink 18. The sensor module 40 may include one or more sensors, such as occupancy sensors $S_O$, ambient light sensors $S_A$, temperature sensors, sound sensors (microphones), image (still or video) sensors, and the like. If multiple sensors are provided, they may be used to sense the same or different environmental conditions. If multiple sensors are used to sense the same environmental conditions, different types of sensors may be used.

As illustrated, the sensor module includes an occupancy sensor 42 and an ambient light sensor, which is internal to the occupancy sensor 42 and not visible in FIG. 7. The ambient light sensor is associated with a light pipe 44, which is used to guide light to the internal ambient light sensor. The sensor module 40 may slide into the end of the heatsink 18 and be held in place by an end cap 46. The end cap 46 may be attached to the heatsink 18 using two screws 48. For the purposes of this description, the term "screw" is defined broadly to cover any externally threaded fastener, including traditional screws that cannot thread with a nut or tapped fixtures and bolts that can thread with nuts or other tapped fixtures.

Figure 8A:
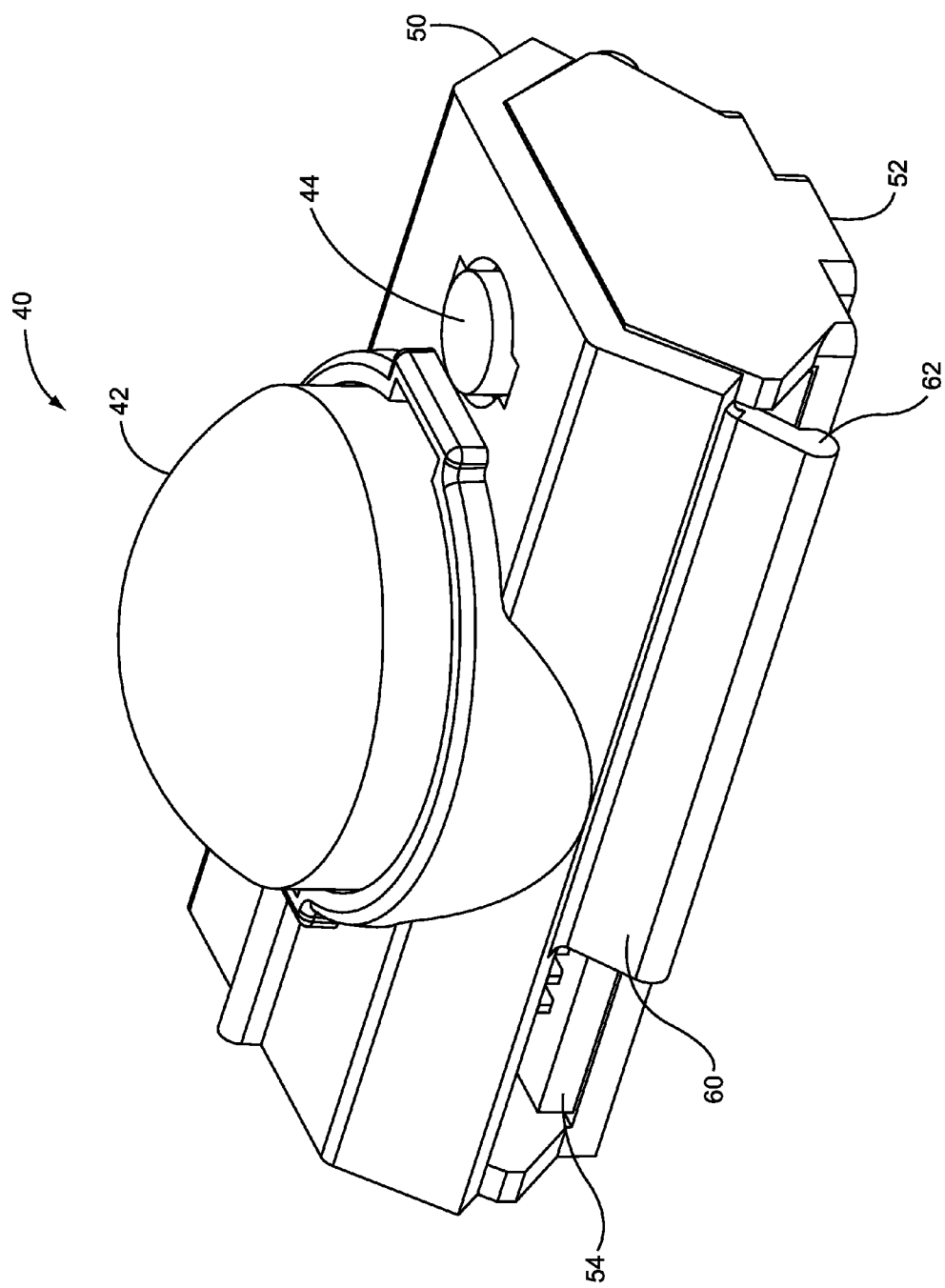
FIG. 8A illustrates a sensor module according to one embodiment of the disclosure.
Figure 8B:
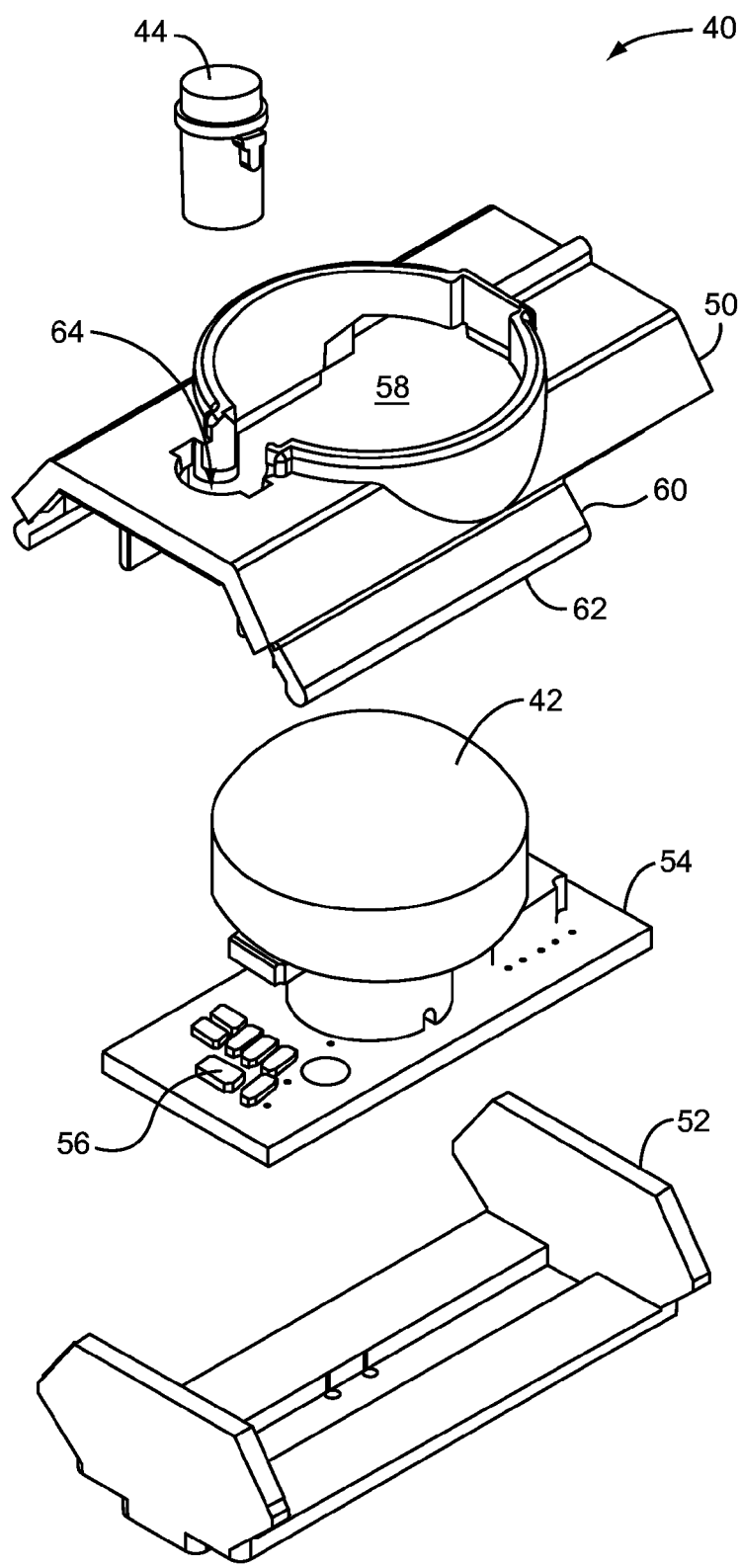
FIG. 8B is an exploded view of the sensor module of FIG. 8A.

FIGS. 8A and 8B illustrate one embodiment of the sensor module 40, which was introduced in FIG. 7. Primary reference is made to the exploded view of FIG. 8B. The sensor module 40 includes an upper housing 50 and a lower housing 52, which are configured to attach to one another through a snap-fit connector or other attachment mechanism, such as screws. A printed circuit board (PCB) 54 mounts inside of the sensor module 40, and the various sensors will mount to, or at least connect to, the PCB 54. In the illustrated embodiment, an ambient light sensor 56 and an occupancy sensor 42 are mounted to the printed circuit board. The ambient light sensor 56 is positioned such that it is aligned directly beneath the light pipe 44 when the light pipe 44 is inserted into a light pipe receptacle 64. The occupancy sensor 42 is aligned with an occupancy sensor opening 58 in the upper housing 50. Typically, the bulbous end of the occupancy sensor 42 extends into and partially through the occupancy sensor opening 58 when the sensor module 40 is assembled, as illustrated in FIG. 8A. In this example, the occupancy sensor 42 is an off-the-shelf passive infrared (PIR) occupancy sensor. The PCB 54 includes a connector, cabling, or wiring harness (not shown) that connects it directly or indirectly to the driver module 30 or the communications module 32.

The sensor module 40 may also include opposing mountings tabs 60, which are used to help attach the sensor module 40 to the heatsink 18. In this embodiment, the outer edges of the mounting tabs 60 expand to form bulbous edges 62.

Figure 9:
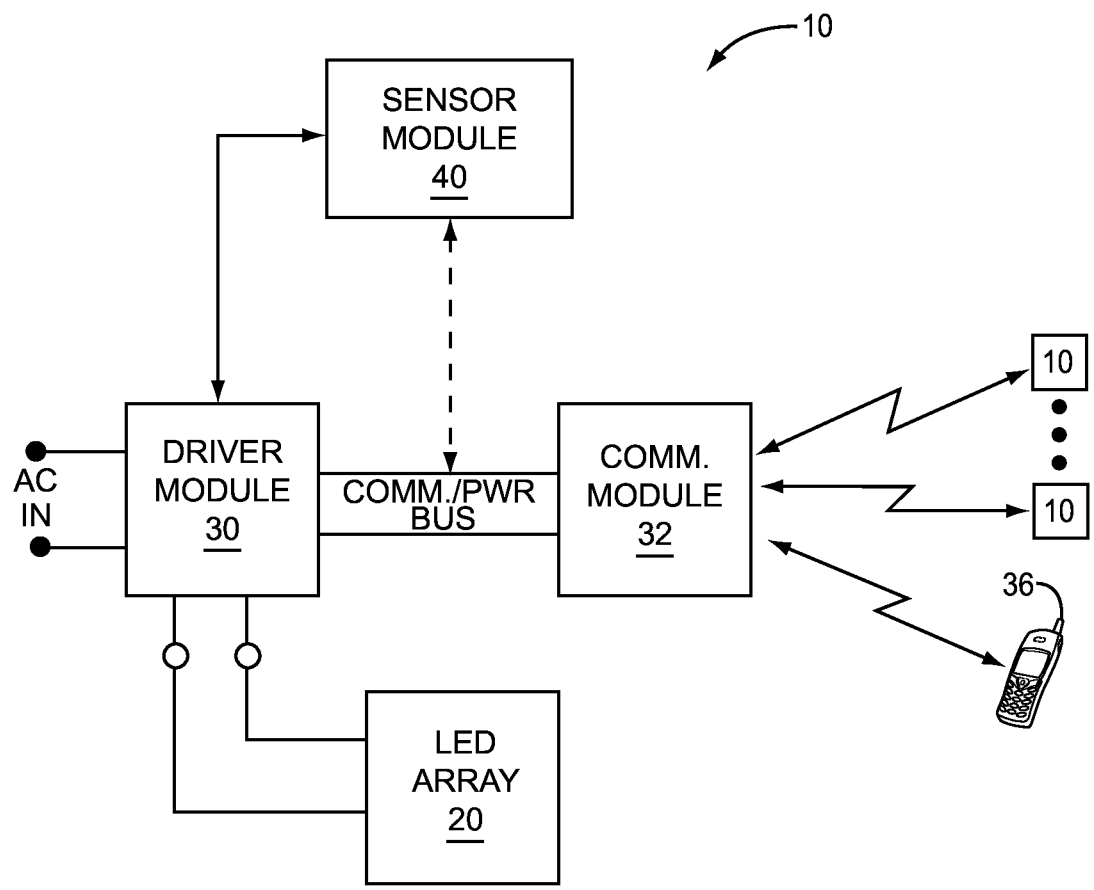
FIG. 9 is a block diagram of a lighting system according to one embodiment of the disclosure.

Turning now to FIG. 9, an electrical block diagram of a lighting fixture 10 is provided according to one embodiment. Assume for purposes of discussion that the driver module 30, communications module 32, and LED array 20 are ultimately connected to form the core electronics of the lighting fixture 10, and that the communications module 32 is configured to bidirectionally communicate with other lighting fixtures 10, the commissioning tool 36, or other control entity through wired or wireless techniques. In this embodiment, a standard communication interface and a first, or standard, protocol are used between the driver module 30 and the communications module 32. This standard protocol allows different driver modules 30 to communicate with and be controlled by different communications modules 32, assuming that both the driver module 30 and the communications module 32 are operating according to the standard protocol used by the standard communication interface. The term "standard protocol" is defined to mean any type of known or future developed, proprietary, or industry-standardized protocol.

In the illustrated embodiment, the driver module 30 and the communications module 32 are coupled via communication and power buses, which may be separate or integrated with one another. The communication bus allows the communications module 32 to receive information from the driver module 30 as well as control the driver module 30. An exemplary communication bus is the well-known inter-integrated circuitry ($I^2C$) bus, which is a serial bus and is typically implemented with a two-wire interface employing data and clock lines. Other available buses include: serial peripheral interface (SPI) bus, Dallas Semiconductor Corporation's 1-Wire serial bus, universal serial bus (USB), RS-232, Microchip Technology Incorporated's UNI/O®, and the like.

In this embodiment, the driver module 30 is configured to collect data from the ambient light sensor $S_A$ and the occupancy sensor $S_O$ and drive the LEDs of the LED array 20. The data collected from the ambient light sensor $S_A$ and the occupancy sensor $S_O$ as well as any other operational parameters of the driver module 30 may be shared with the communications module 32. As such, the communications module 32 may collect data about the configuration or operation of the driver module 30 and any information made available to the driver module 30 by the LED array 20, the ambient light sensor $S_A$, and the occupancy sensor $S_O$. The collected data may be used by the communications module 32 to control how the driver module 30 operates, may be shared with other lighting fixtures 10 or control entities, or may be processed to generate instructions that are sent to other lighting fixtures 10. Notably, the sensor module 40 may be coupled to the communications bus instead of directly to the driver module 30, such that sensor information from the sensor module 40 may be provided to the driver module 30 or the communications module 32 via the communications bus.

The communications module 32 may also be controlled in whole or in part by a remote control entity, such as the commissioning tool 36 or another lighting fixture 10. In general, the communications module 32 will process sensor data and instructions provided by the other lighting fixtures 10 or remote control entities and then provide instructions over the communication bus to the driver module 30. An alternative way of looking at it is that the communications module 32 facilitates the sharing of the system's information, including occupancy sensing, ambient light sensing, dimmer switch settings, etc., and provides this information to the driver module 30, which then uses its own internal logic to determine what action(s) to take. The driver module 30 will respond by controlling the drive current or voltages provided to the LED array 20 as appropriate.

In certain embodiments, the driver module 30 includes sufficient electronics to process an alternating current (AC) input signal (AC IN) and provide an appropriate rectified or direct current (DC) signal sufficient to power the communications module 32, and perhaps the LED array 20. As such, the communications module 32 does not require separate AC-to-DC conversion circuitry to power the electronics residing therein, and can simply receive DC power from the driver module 30 over the power bus. Similarly, the sensor module 40 may receive power directly from the driver module 30 or via the power bus, which is powered by the driver module 30 or other source. The sensor module 40 may also be coupled to a power source (not shown) independently of the driver and communications modules 30, 32.

In one embodiment, one aspect of the standard communication interface is the definition of a standard power delivery system. For example, the power bus may be set to a low voltage level, such as 5 volts, 12 volts, 24 volts, or the like. The driver module 30 is configured to process the AC input signal to provide the defined low voltage level and provide that voltage over the power bus, thus the communications module 32 or auxiliary devices, such as the sensor module 40, may be designed in anticipation of the desired low voltage level being provided over the power bus by the driver module 30 without concern for connecting to or processing an AC signal to a DC power signal for powering the electronics of the communications module 32 or the sensor module 40.

Figure 10:
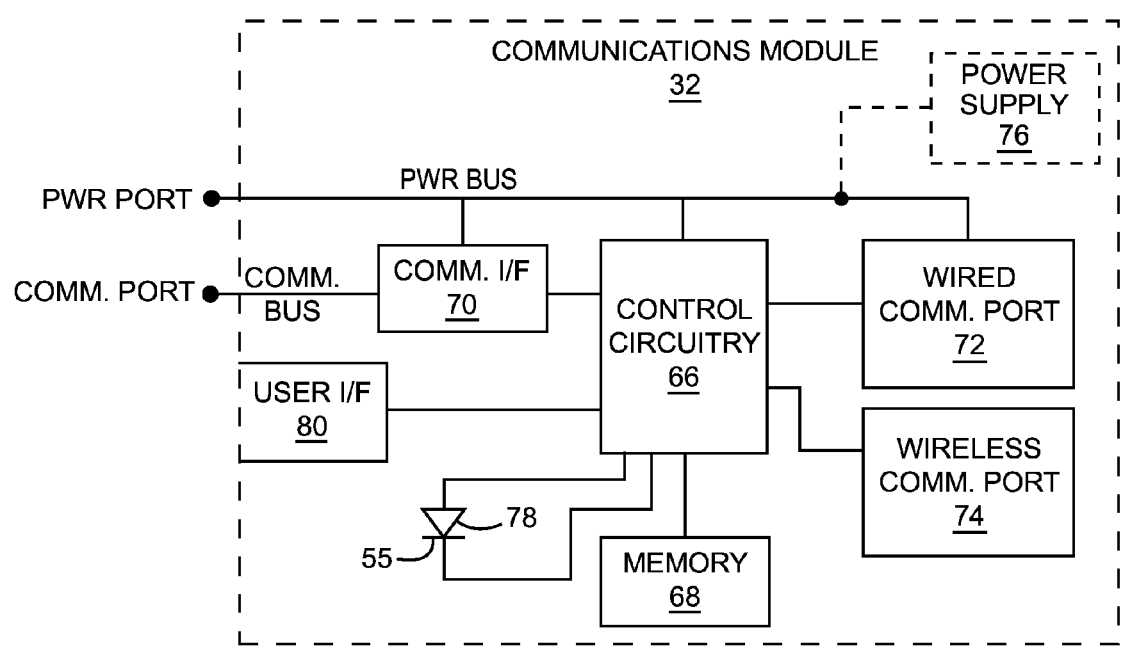
FIG. 10 is a block diagram of a communications module according to one embodiment of the disclosure.

With reference to FIG. 10, a block diagram of one embodiment of the communications module 32 is illustrated. The communications module 32 includes control circuitry 66 and associated memory 68, which contains the requisite software instructions and data to facilitate operation as described herein. The control circuitry 66 may be associated with a communication interface 70, which is to be coupled to the driver module 30, directly or indirectly via the communication bus. The control circuitry 66 may be associated with a wired communication port 72, a wireless communication port 74, or both, to facilitate wired or wireless communications with other lighting fixtures 10, the commissioning tool 36, and remote control entities. The wireless communication port 74 may include the requisite transceiver electronics to facilitate wireless communications with remote entities. The wired communication port 72 may support universal serial (USB), Ethernet, or like interfaces.

The capabilities of the communications module 32 may vary greatly from one embodiment to another. For example, the communications module 32 may act as a simple bridge between the driver module 30 and the other lighting fixtures 10 or remote control entities. In such an embodiment, the control circuitry 66 will primarily pass data and instructions received from the other lighting fixtures 10 or remote control entities to the driver module 30, and vice versa. The control circuitry 66 may translate the instructions as necessary based on the protocols being used to facilitate communications between the driver module 30 and the communications module 32 as well as between the communications module 32 and the remote control entities.

In other embodiments, the control circuitry 66 plays an important role in coordinating intelligence and sharing data among the lighting fixtures 10 as well as providing significant, if not complete, control of the driver module 30. While the communications module 32 may be able to control the driver module 30 by itself, the control circuitry 66 may also be configured to receive data and instructions from the other lighting fixtures 10 or remote control entities and use this information to control the driver module 30. The communications module 32 may also provide instructions to other lighting fixtures 10 and remote control entities based on the sensor data from the associated driver module 30 as well as the sensor data and instructions received from the other lighting fixtures 10 and remote control entities.

Power for the control circuitry 66, memory 68, the communication interface 70, and the wired and/or wireless communication ports 72 and 74 may be provided over the power bus via the power port. As noted above, the power bus may receive its power from the driver module 30, which generates the DC power signal. As such, the communications module 32 may not need to be connected to AC power or include rectifier and conversion circuitry. The power port and the communication port may be separate or may be integrated with the standard communication interface. The power port and communication port are shown separately for clarity. In one embodiment, the communication bus is a 2-wire serial bus, wherein the connector or cabling configuration may be configured such that the communication bus and the power bus are provided using four wires: data, clock, power, and ground. In alternative embodiments, an internal power supply 76, which is associated with AC power or a battery is used to supply power.

The communications module 32 may have a status indicator, such as an LED 78 to indicate the operating state of the communication module. Further, a user interface 80 may be provided to allow a user to manually interact with the communications module 32. The user interface 80 may include an input mechanism, an output mechanism, or both. The input mechanism may include one or more of buttons, keys, keypads, touchscreens, or the like. The output mechanism may include one more LEDs, a display, or the like. For the purposes of this application, a button is defined to include a push button switch, all or part of a toggle switch, rotary dial, slider, or any other mechanical input mechanism.

Figure 11:
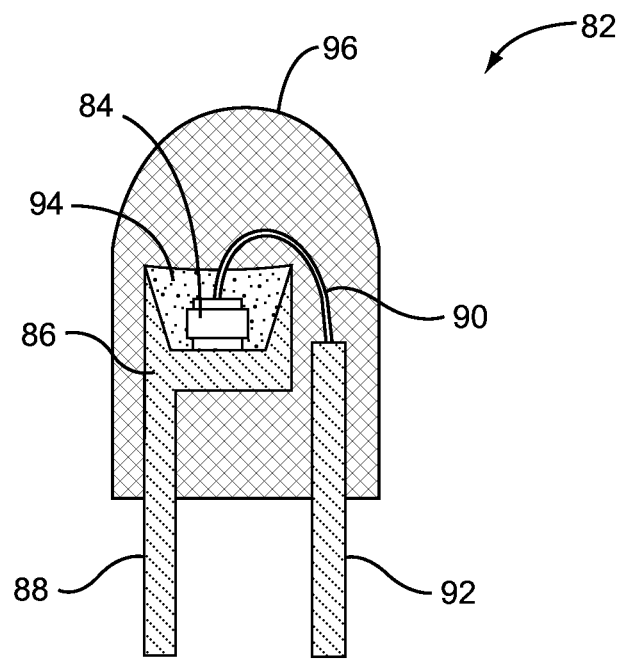
FIG. 11 is a cross section of an exemplary LED according to a first embodiment of the disclosure.

A description of an exemplary embodiment of the LED array 20, driver module 30, and the communications module 32 follows. As noted, the LED array 20 includes a plurality of LEDs, such as the LEDs 82 illustrated in FIGS. 11 and 12. With reference to FIG. 11, a single LED chip 84 is mounted on a reflective cup 86 using solder or a conductive epoxy, such that ohmic contacts for the cathode (or anode) of the LED chip 84 are electrically coupled to the bottom of the reflective cup 86. The reflective cup 86 is either coupled to or integrally formed with a first lead 88 of the LED 82. One or more bond wires 90 connect ohmic contacts for the anode (or cathode) of the LED chip 84 to a second lead 92.

The reflective cup 86 may be filled with an encapsulant material 94 that encapsulates the LED chip 84. The encapsulant material 94 may be clear or contain a wavelength conversion material, such as a phosphor, which is described in greater detail below. The entire assembly is encapsulated in a clear protective resin 96, which may be molded in the shape of a lens to control the light emitted from the LED chip 84.

Figure 12:
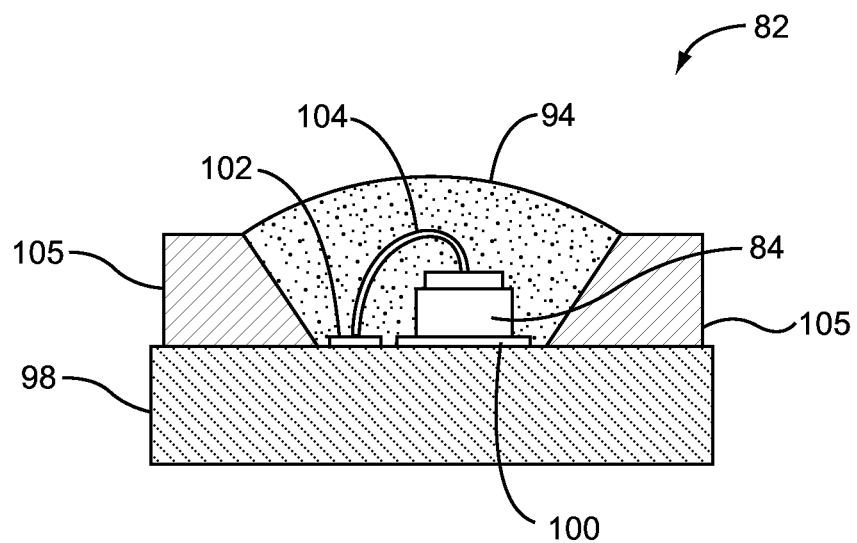
FIG. 12 is a cross section of an exemplary LED according to a second embodiment of the disclosure.

An alternative package for an LED 82 is illustrated in FIG. 12 wherein the LED chip 84 is mounted on a substrate 98. In particular, the ohmic contacts for the anode (or cathode) of the LED chip 84 are directly mounted to first contact pads 100 on the surface of the substrate 98. The ohmic contacts for the cathode (or anode) of the LED chip 84 are connected to second contact pads 102, which are also on the surface of the substrate 98, using bond wires 104. The LED chip 84 resides in a cavity of a reflector structure 105, which is formed from a reflective material and functions to reflect light emitted from the LED chip 84 through the opening formed by the reflector structure 105. The cavity formed by the reflector structure 105 may be filled with an encapsulant material 94 that encapsulates the LED chip 84. The encapsulant material 94 may be clear or contain a wavelength conversion material, such as a phosphor.

In either of the embodiments of FIGS. 11 and 12, if the encapsulant material 94 is clear, the light emitted by the LED chip 84 passes through the encapsulant material 94 and the protective resin 96 without any substantial shift in color. As such, the light emitted from the LED chip 84 is effectively the light emitted from the LED 82. If the encapsulant material 94 contains a wavelength conversion material, substantially all or a portion of the light emitted by the LED chip 84 in a first wavelength range may be absorbed by the wavelength conversion material, which will responsively emit light in a second wavelength range. The concentration and type of wavelength conversion material will dictate how much of the light emitted by the LED chip 84 is absorbed by the wavelength conversion material as well as the extent of the wavelength conversion. In embodiments where some of the light emitted by the LED chip 84 passes through the wavelength conversion material without being absorbed, the light passing through the wavelength conversion material will mix with the light emitted by the wavelength conversion material. Thus, when a wavelength conversion material is used, the light emitted from the LED 82 is shifted in color from the actual light emitted from the LED chip 84.

For example, the LED array 20 may include a group of BSY or BSG LEDs 82 as well as a group of red LEDs 82. BSY LEDs 82 include an LED chip 84 that emits bluish light, and the wavelength conversion material is a yellow phosphor that absorbs the blue light and emits yellowish light. Even if some of the bluish light passes through the phosphor, the resultant mix of light emitted from the overall BSY LED 82 is yellowish light. The yellowish light emitted from a BSY LED 82 has a color point that falls above the Black Body Locus (BBL) on the 1976 CIE chromaticity diagram wherein the BBL corresponds to the various color temperatures of white light.

Similarly, BSG LEDs 82 include an LED chip 84 that emits bluish light; however, the wavelength conversion material is a greenish phosphor that absorbs the blue light and emits greenish light. Even if some of the bluish light passes through the phosphor, the resultant mix of light emitted from the overall BSG LED 82 is greenish light. The greenish light emitted from a BSG LED 82 has a color point that falls above the BBL on the 1976 CIE chromaticity diagram wherein the BBL corresponds to the various color temperatures of white light.

The red LEDs 82 generally emit reddish light at a color point on the opposite side of the BBL as the yellowish or greenish light of the BSY or BSG LEDs 82. As such, the reddish light from the red LEDs 82 may mix with the yellowish or greenish light emitted from the BSY or BSG LEDs 82 to generate white light that has a desired color temperature and falls within a desired proximity of the BBL. In effect, the reddish light from the red LEDs 82 pulls the yellowish or greenish light from the BSY or BSG LEDs 82 to a desired color point on or near the BBL. Notably, the red LEDs 82 may have LED chips 84 that natively emit reddish light wherein no wavelength conversion material is employed. Alternatively, the LED chips 84 may be associated with a wavelength conversion material, wherein the resultant light emitted from the wavelength conversion material and any light that is emitted from the LED chips 84 without being absorbed by the wavelength conversion material mixes to form the desired reddish light.

The blue LED chip 84 used to form either the BSY or BSG LEDs 82 may be formed from a gallium nitride (GaN), indium gallium nitride (InGaN), silicon carbide (SiC), zinc selenide (ZnSe), or like material system. The red LED chip 84 may be formed from an aluminum indium gallium nitride (AlInGaP), gallium phosphide (GaP), aluminum gallium arsenide (AlGaAs), or like material system. Exemplary yellow phosphors include cerium-doped yttrium aluminum garnet (YAG:Ce), yellow BOSE (Ba, O, Sr, Si, Eu) phosphors, and the like. Exemplary green phosphors include green BOSE phosphors, Lutetium aluminum garnet (LuAg), cerium doped LuAg (LuAg:Ce), Maui M535 from Lightscape Materials, Inc. of 201 Washington Road, Princeton, N.J. 08540, and the like. The above LED architectures, phosphors, and material systems are merely exemplary and are not intended to provide an exhaustive listing of architectures, phosphors, and materials systems that are applicable to the concepts disclosed herein.

Figure 13:
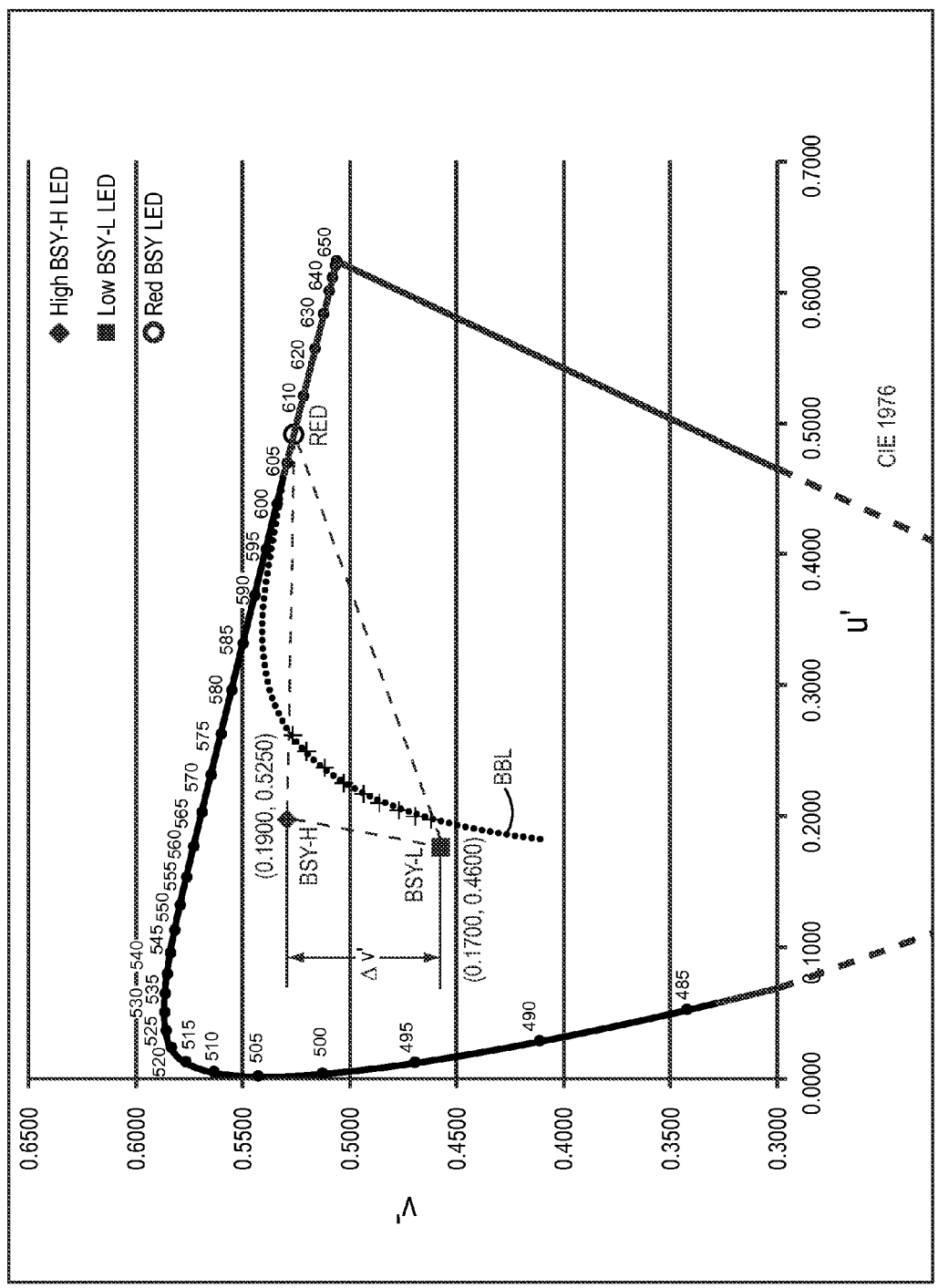
FIG. 13 is CIE 1976 chromaticity diagram that illustrates the color points for three different LEDs and a black body locus.

The International Commission on Illumination (Commission internationale de l'éclairage, or CIE) has defined various chromaticity diagrams over the years. The chromaticity diagrams are used to project a color space that represents all human perceivable colors without reference to brightness or luminance. FIG. 13 illustrates a CIE 1976 chromaticity diagram, which includes a portion of a Planckian locus, or black body locus (BBL). The BBL is a path within the color space that the color of an incandescent black body would travel as the temperature of the black body changes. While the color of the incandescent body may range from an orangish-red to blue, the middle portions of the path encompass what is traditionally considered as "white light."

Correlated Color Temperature (CCT), or color temperature, is used to characterize white light. CCT is measured in kelvin (K) and defined by the Illuminating Engineering Society of North America (IESNA) as "the absolute temperature of a blackbody whose chromaticity most nearly resembles that of the light source." Light output that is:

below 3200 K is a yellowish white and generally considered to be warm (white) light;

between 3200 K and 4000 K is generally considered neutral (white) light; and above 4000 K is bluish-white and generally considered to be cool (white) light.

The coordinates (u', v') are used to define color points within the color space of the CIE 1976 chromaticity diagram. The v' value defines a vertical position and the u' value defines a horizontal position. As an example, the color points for a first BSY LED 82 is about (0.1900, 0.5250), a second BSY LED 82 is about (0.1700, 0.4600), and a red LED 82 is about (0.4900, 0.5600). Notably, the first and second BSY LEDs 82 are significantly spaced apart from one another along the v' axis. As such, the first BSY LED 82 is much higher than the second BSY LED 82 in the chromaticity diagram. For ease of reference, the higher, first BSY LED 82 is referenced as the high BSY-H LED, and the lower, second BSY LED 82 is referenced as the low BSY-L LED.

As such, the Δv' for the high BSY-H LED and the low BSY-L LED is about 0.065 in the illustrated example. In different embodiments, the Δv' may be greater than 0.025, 0.030, 0.033, 0.040 0.050, 0.060, 0.075, 0.100, 0.110, and 0.120, respectively. Exemplary, but not absolute upper bounds for Δv' may be 0.150, 0.175, or 0.200 for any of the aforementioned lower bounds. For groups of LEDs of a particular color, the Δv' between two groups of LEDs is the difference between the average v' values for each group of LEDs. As such, the Δv' between groups of LEDs of a particular color may also be greater than 0.030, 0.033, 0.040 0.050, 0.060, 0.075, 0.100, 0.110, and 0.120, respectively, with the same upper bounds as described above. Further, the variation of color points among the LEDs 82 within a particular group of LEDs may be limited to within a seven, five, four, three, or two-step MacAdam ellipse in certain embodiments. In general, the greater the delta v', the larger the range through which the CCT of the white light can be adjusted along the black body locus. The closer the white light is to the black body locus, the more closely the white light will replicate that of an incandescent radiator.

In one embodiment, the LED array 20 includes a first LED group of only low BSY-L LEDs, a second LED group of only high BSY-H LEDs, and a third LED group of only red LEDs. The currents used to drive the first, second, and third LED groups may be independently controlled such that the intensity of the light output from the first, second, and third LED groups is independently controlled. As such, the light output for the first, second, and third LED groups may be blended or mixed to create a light output that has an overall color point virtually anywhere within a triangle formed by the color points of the respective low BSY-L LEDs, high BSY-H LEDs, and the red LEDs. Within this triangle resides a significant portion of the BBL, and as such, the overall color point of the light output may be dynamically adjusted to fall along the portion of the BBL that resides within the triangle.

A crosshatch pattern highlights the portion of the BBL that falls within the triangle. Adjusting the overall color point of the light output along the BBL corresponds to adjusting the CCT of the light output, which as noted above is considered white light when falling on the BBL. In one embodiment, the CCT of the overall light output may be adjusted over a range from about 2700 K to about 5700 K. In another embodiment, the CCT of the overall light output may be adjusted over a range from about 3000 K to 5000 K. In yet another embodiment, the CCT of the overall light output may be adjusted over a range from about 2700 K to 5000 K. In yet another embodiment, the CCT of the overall light output may be adjusted over a range from about 3000 K to 4000 K. These variations in CCT can be accomplished while maintaining a high color rendering index value (CRI), such as a CRI equal to or greater than 90.

To be considered "white" light, the overall color point does not have to fall precisely on the BBL. Unless defined otherwise and for the purposes of this application only, a color point within a five-step MacAdam ellipse of the BBL is defined as white light on the BBL. For tighter tolerances, four, three, and two-step MacAdam ellipses may be defined.

Figure 14:
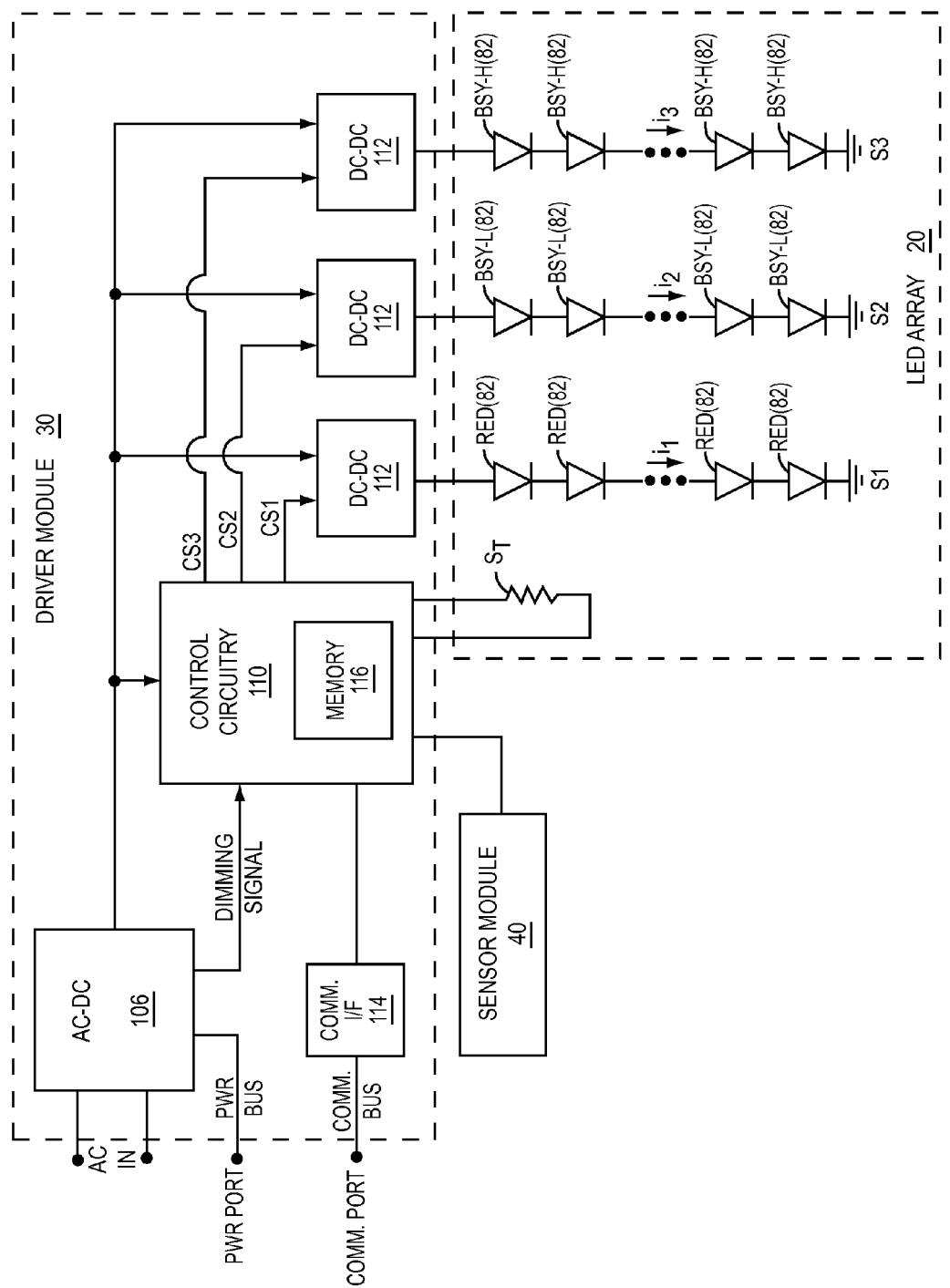
FIG. 14 is a schematic of a driver module and an LED array according to one embodiment of the disclosure.

As noted, the LED array 20 may include a mixture of red LEDs 82, high BSY-H LEDs 82, and low BSY-L LEDs 82. The driver module 30 for driving the LED array 20 is illustrated in FIG. 14, according to one embodiment of the disclosure. The LED array 20 may be divided into multiple strings of series connected LEDs 82. In essence, LED string S1, which includes a number of red LEDs (RED), forms a first group of LEDs 82. LED string S2, which includes a number of low BSY LEDs (BSY-L), forms a second group of LEDs 82. And, LED string S3, which includes a number of high BSY LEDs (BSY-H), forms a third group of LEDs 82.

For clarity, the various LEDs 82 of the LED array 20 are referenced as RED, BSY-L, and BSY-H in FIG. 14 to clearly indicate which LEDs are located in the various LED strings S1, S2, and S3. While BSY LEDs 82 are illustrated, BSG or other phosphor-coated, wavelength converted LEDs may be employed in analogous fashion. For example, a string of high BSG-H LEDs 82 may be combined with a string of low BSG-L LEDs 82, and vice versa. Further, a string of low BSY-H LEDs may be combined with a string of high BSG-H LEDs, and vice versa. Non-phosphor-coated LEDs, such as non-wavelength converted red, green, and blue LEDs, may also be employed in certain embodiments.

In general, the driver module 30 controls the currents $i_1$, $i_2$, and $i_3$, which are used to drive the respective LED strings S1, S2, and S3. The ratio of currents $i_1$, $i_2$, and $i_3$ that are provided through respective LED strings S1, S2, and S3 may be adjusted to effectively control the relative intensities of the reddish light emitted from the red LEDs 82 of LED string S1, the yellowish/greenish light emitted from the low BSY-L LEDs 82 of LED string S2, and the yellow/greenish light emitted from the high BSY-H LEDs 82 of LED string S3. The resultant light from each LED string S1, S2, and S3 mixes to generate an overall light output that has a desired color, CCT, and intensity, the later of which may also be referred to a dimming level. As noted, the overall light output may be white light that falls on or within a desired proximity of the BBL and has a desired CCT.

The number of LED strings Sx may vary from one to many and different combinations of LED colors may be used in the different strings. Each LED string Sx may have LEDs 82 of the same color, variations of the same color, or substantially different colors. In the illustrated embodiment, each LED string S1, S2, and S3 is configured such that all of the LEDs 82 that are in the string are all essentially identical in color. However, the LEDs 82 in each string may vary substantially in color or be completely different colors in certain embodiments. In another embodiment, three LED strings Sx with red, green, and blue LEDs may be used, wherein each LED string Sx is dedicated to a single color. In yet another embodiment, at least two LED strings Sx may be used, wherein different colored BSY or BSG LEDs are used in one of the LED strings Sx and red LEDs are used in the other of the LED strings Sx. A single string embodiment is also envisioned, where currents may be individually adjusted for the LEDs of the different colors using bypass circuits, or the like.

The driver module 30 depicted in FIG. 14 generally includes AC-DC conversion circuitry 106, control circuitry 110, and a number of current sources, such as the illustrated DC-DC converters 112. The AC-DC conversion circuitry 106 is adapted to receive an AC power signal (AC IN), rectify the AC power signal, correct the power factor of the AC power signal, and provide a DC output signal. The DC output signal may be used to directly power the control circuitry 110 and any other circuitry provided in the driver module 30, including the DC-DC converters 112, a communication interface 114, as well as the sensor module 40.

The DC output signal may also be provided to the power bus, which is coupled to one or more power ports, which may be part of the standard communication interface. The DC output signal provided to the power bus may be used to provide power to one or more external devices that are coupled to the power bus and separate from the driver module 30. These external devices may include the communications module 32 and any number of auxiliary devices, such as the sensor module 40. Accordingly, these external devices may rely on the driver module 30 for power and can be efficiently and cost effectively designed accordingly. The AC-DC conversion circuitry 108 of the driver module 30 is robustly designed in anticipation of being required to supply power to not only its internal circuitry and the LED array 20, but also to supply power to these external devices. Such a design greatly simplifies the power supply design, if not eliminating the need for a power supply, and reduces the cost for these external devices.

As illustrated, the three respective DC-DC converters 112 of the driver module 30 provide currents $i_1$, $i_2$, and $i_3$ for the three LED strings S1, S2, and S3 in response to control signals CS1, CS2, and CS3. The control signals CS1, CS2, and CS3 may be pulse width modulated (PWM) signals that effectively turn the respective DC-DC converters on during a logic high state and off during a logic low state of each period of the PWM signal. In one embodiment the control signals CS1, CS2, and CS3 are the product of two PWM signals.

The first PWM signal is a higher frequency PWM signal that has a duty cycle that effectively sets the DC current level through a corresponding one of LED strings S1, S2, and S3, when current is allowed to pass through the LED strings S1, S2, and S3. The second PWM signal is a lower frequency signal that has a duty cycle that corresponds a desired dimming or overall output level. In essence, the higher frequency PWM signals set the relative current levels though each LED string S1, S2, and S3 while the lower frequency PWM signal determines how long the currents $i_1$, $i_2$, and $i_3$ are allowed to pass through the LED strings S1, S2, and S3 during each period of the lower frequency PWM signal. The longer the currents $i_1$, $i_2$, and $i_3$ are allowed to flow through the LED strings S1, S2, and S3 during each period, the higher the output level, and vice versa. Given the reactive components associated with the DC-DC converters 112, the relative current levels set with the higher frequency PWM signals may be filtered to a relative DC current. However, this DC current is essentially pulsed on and off based on the duty cycle of the lower frequency PWM signal. For example, the higher frequency PWM signal may have a switching frequency of around 200 KHz, while the lower frequency PWM signal may have a switching frequency of around 1 KHz.

In certain instances, a dimming device may control the AC power signal. The AC-DC conversion circuitry 106 may be configured to detect the relative amount of dimming associated with the AC power signal and provide a corresponding dimming signal to the control circuitry 110. Based on the dimming signal, the control circuitry 110 will adjust the currents $i_1$, $i_2$, and $i_3$ provided to each of the LED strings S1, S2, and S3 to effectively reduce the intensity of the resultant light emitted from the LED strings S1, S2, and S3 while maintaining the desired CCT. As described further below, the CCT and dimming levels may be initiated internally or received from the commissioning tool 36, a wall controller, or another lighting fixture 10. If received from an external device via the communications module 32, the CCT and/or dimming levels are delivered from the communications module 32 to the control circuitry 110 of the driver module 30 in the form of a command via the communication bus. The driver module 30 will respond by controlling the currents $i_1$, $i_2$, and $i_3$ in the desired manner to achieve the requested CCT and/or dimming levels.

The intensity and CCT of the light emitted from the LEDs 82 may be affected by temperature. If associated with a thermistor $S_T$ or other temperature-sensing device, the control circuitry 110 can control the currents $i_1$, $i_2$, and $i_3$ provided to each of the LED strings S1, S2, and S3 based on ambient temperature of the LED array 20 in an effort to compensate for temperature effects. The control circuitry 110 may also monitor the output of the occupancy and ambient light sensors $S_O$ and $S_A$ for occupancy and ambient light information and further control the currents $i_1$, $i_2$, and $i_3$ in a desired fashion. Each of the LED strings S1, S2, and S3 may have different temperature compensation adjustments, which may also be functions of the magnitude of the various currents $i_1$, $i_2$, and $i_3$.

The control circuitry 110 may include a central processing unit (CPU) and sufficient memory 116 to enable the control circuitry 110 to bidirectionally communicate with the communications module 32 or other devices over the communication bus through an appropriate communication interface (I/F) 114 using a defined protocol, such as the standard protocol described above. The control circuitry 110 may receive instructions from the communications module 32 or other device and take appropriate action to implement the received instructions. The instructions may range from controlling how the LEDs 82 of the LED array 20 are driven to returning operational data, such as temperature, occupancy, light output, or ambient light information, that was collected by the control circuitry 110 to the communications module 32 or other device via the communication bus. Notably, the functionality of the communications module 32 may be integrated into the driver module 30, and vice versa.

Figure 15:
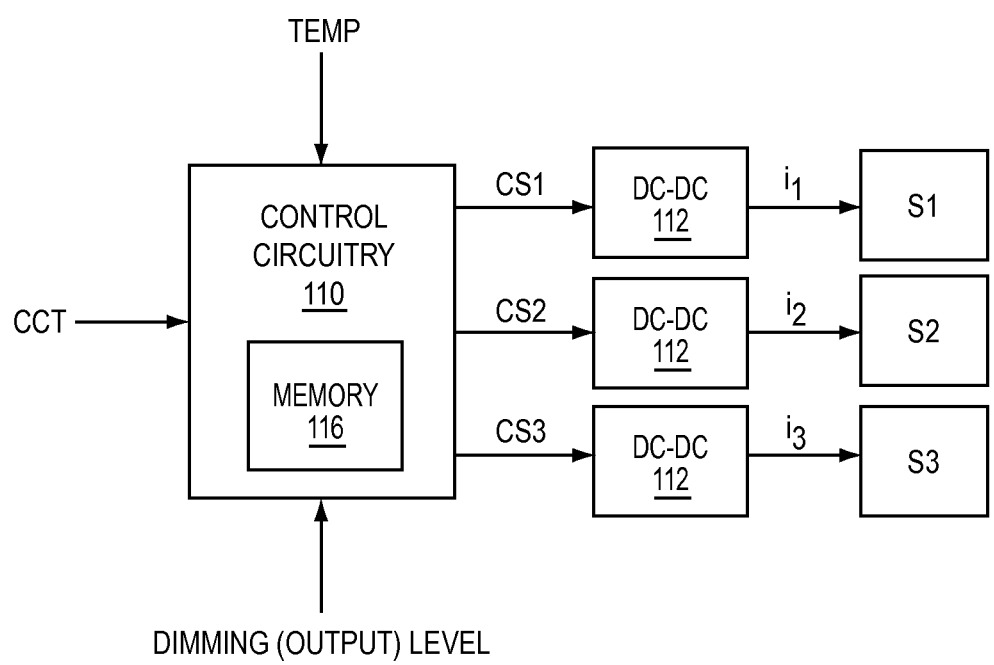
FIG. 15 illustrates a functional schematic of the driver module of FIG. 14.

With reference to FIG. 15, an exemplary way to control the currents $i_1$, $i_2$, and $i_3$, which are provided to the respective LED strings S1, S2, and S3 is illustrated, such that the CCT of the overall light output can be finely tuned over a relatively long range and throughout virtually any dimming level. As noted above, the control circuitry 110 generates control signals CS1, CS2, and CS3, which control the currents $i_1$, $i_2$, and $i_3$. Those skilled in the art will recognize other ways to control the currents $i_1$, $i_2$, and $i_3$.

In essence, the control circuitry 110 of the driver module 30 is loaded with a current model in the form of one or more functions (equation) or look up tables for each of the currents $i_1$, $i_2$, and $i_3$. Each current model is a reference model that is a function of dimming or output level, temperature, and CCT. The output of each model provides a corresponding control signal CS1, CS2, and CS3, which effectively sets the currents $i_1$, $i_2$, and $i_3$ in the LED strings S1, S2, and S3. The three current models are related to each other. At any given output level, temperature, and CCT, the resulting currents $i_1$, $i_2$, and $i_3$ cause the LED strings S1, S2, and S3 to emit light, which when combined, provides an overall light output that has a desired output level and CCT, regardless of temperature. While the three current models do not need to be a function of each other, they are created to coordinate with one another to ensure that the light from each of the strings S1, S2, and S3 mix with one another in a desired fashion.

Figure 16:
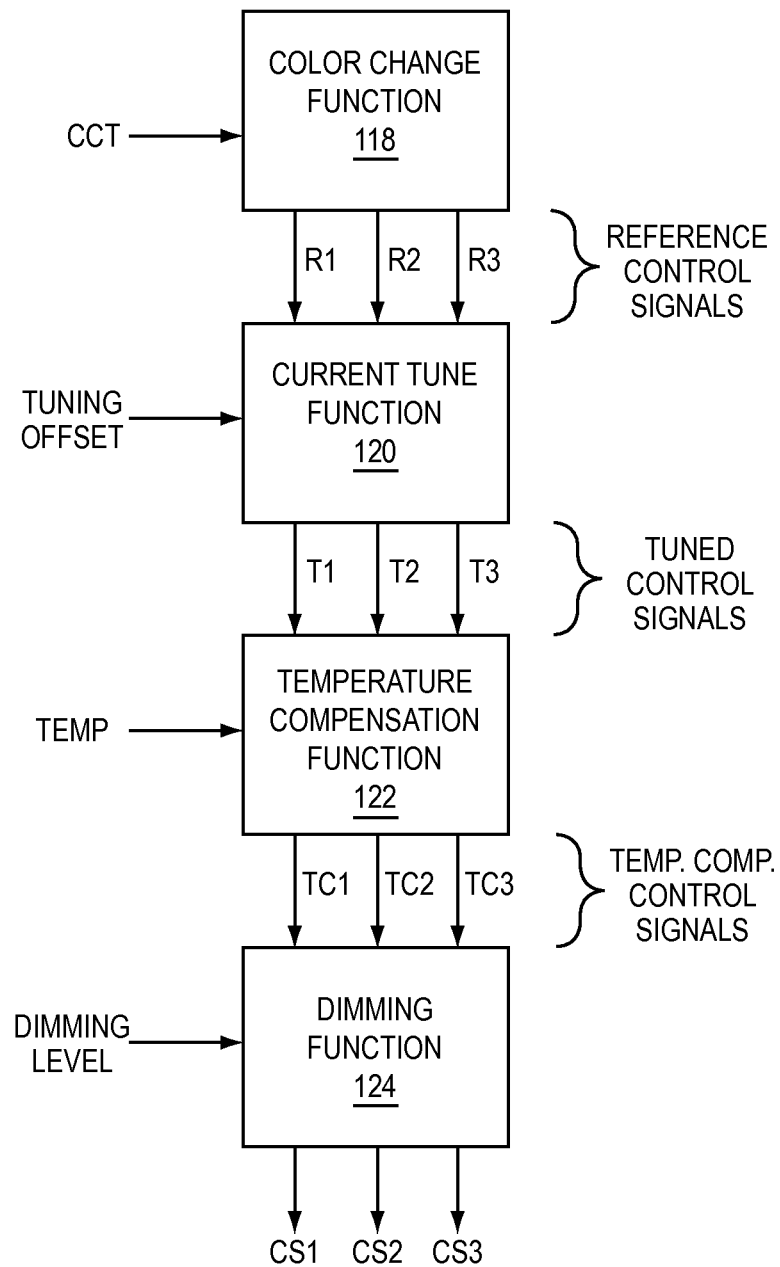
FIG. 16 is a flow diagram that illustrates the functionality of the driver module according to one embodiment.

With reference to FIG. 16, an exemplary process for generating the control signals CS1, CS2, and CS3 is provided. Initially, assume that the current models are loaded in the memory 116 of the control circuitry 110. Further assume that the current models are reference models for the particular type of lighting fixture 10.

Further assume that the desired CCT is input to a color change function 118, which is based on the reference models. The color change function 118 selects reference control signals R1, R2, and R3 for each of the currents $i_1$, $i_2$, and $i_3$ based on the desired CCT. Next, the reference control signals R1, R2, and R3 are each adjusted, if necessary, by a current tune function 120 based on a set of tuning offsets. The turning offsets may be determined through a calibration process during manufacturing or testing and uploaded into the control circuitry 110. The tuning offset correlates to a calibration adjustment to the currents $i_1$, $i_2$, and $i_3$ that should be applied to get the CCT of the overall light output to match a reference CCT. Details about the tuning offsets are discussed further below. In essence, the current tune function 120 modifies the reference control signals R1, R2, and R3 based on the tuning offsets to provide tuned control signals T1, T2, and T3.

In a similar fashion, the temperature compensation function 122 modifies the tuned control signals T1, T2, and T3 based on the current temperature measurements to provide temperature compensated control signals TC1, TC2, and TC3. Since light output from the various LEDs 82 may vary in intensity and color over temperature, the temperature compensation function 122 effectively adjusts the currents $i_1$, $i_2$, and $i_3$ to substantially counter the effect of these variations. The temperature sensor $S_T$ may provide the temperature input and is generally located near the LED array 20.

Finally, the dimming function 124 modifies the temperature compensated control signals TC1, TC2, and TC3 based on the desired dimming (output) levels to provide the controls signals CS1, CS2, and CS3, which drive the DC-DC converters 112 to provide the appropriate currents $i_1$, $i_2$, and $i_3$ to the LED strings S1, S2, and S3. Since light output from the various LEDs 82 may also vary in relative intensity and color over varying current levels, the dimming function 124 helps to ensure that the CCT of the overall light output corresponds to the desired CCT and intensity at the selected dimming (output) levels.

A wall controller, commissioning tool 36, or other lighting fixture 10 may provide the CCT setting and dimming levels. Further, the control circuitry 110 may be programmed to set the CCT and dimming levels according to a defined schedule, state of the occupancy and ambient light sensors $S_O$ and $S_A$, other outside control input, time of day, day of week, date, or any combination thereof. For example, these levels may be controlled based on a desired efficiency or correlated color temperature.

These levels may be controlled based the intensity (level) and/or spectral content of the ambient light, which is measured by the ambient light sensor $S_A$. When controlled based on spectral content, the dimming or CCT levels may be adjusted based on the overall intensity of the ambient light. Alternatively, the dimming levels, color point, or CCT levels may be adjusted to either match the spectral content of the ambient light or help fill in spectral areas of the ambient light that are missing or attenuated. For example, if the ambient light is deficient in a cooler area of the spectrum, the light output may be adjusted to provide more light in that cooler area of the spectrum, such that the ambient light and light provided by the lighting fixtures 10 combine to provide a desired spectrum. CCT, dimming, or color levels may also be controlled based on power conditions (power outage, battery backup operation, etc.), or emergency conditions (fire alarm, security alarm, weather warning, etc.).

Figure 17:
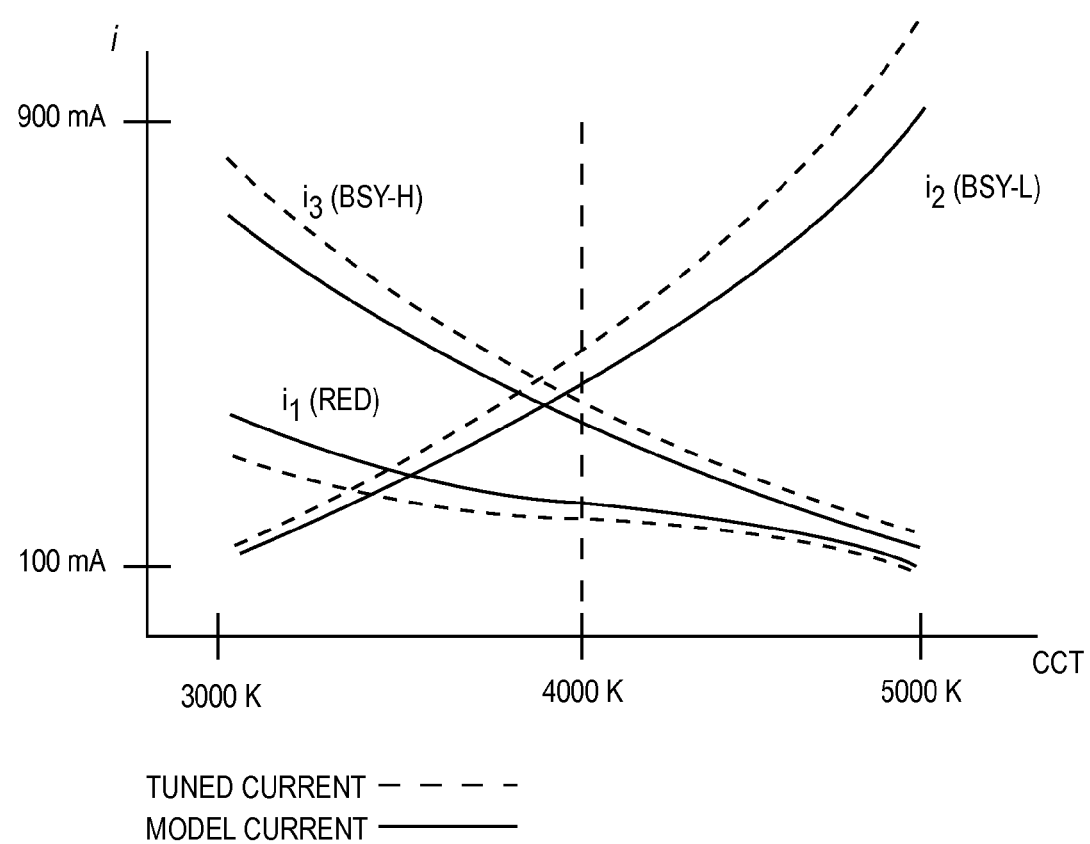
FIG. 17 is a graph that plots individual LED current versus CCT for overall light output according to one embodiment.

As noted, the tuning offset is generally determined during manufacture, but may also be determined and loaded into the lighting fixture 10 in the field. The tuning offset is stored in memory 116 and correlates to a calibration adjustment to the currents $i_1$, $i_2$, and $i_3$ that should be applied to get the CCT of the overall light output to match a reference CCT. With reference to FIG. 17, exemplary current curves are provided for reference (pre-tuned) currents and tuned (post-tuned) currents $i_1$, $i_2$, and $i_3$ over a CCT range of about 3000 K to 5000 K. The reference currents represent the currents $i_1$, $i_2$, and $i_3$ that are expected to provide a desired CCT in response to the reference control signals R1, R2, and R3 for the desired CCT. However, the actual CCT that is provided in response to the reference currents $i_1$, $i_2$, and $i_3$ may not match the desired CCT based on variations in the electronics in the driver module 30 and the LED array 20. As such, the reference currents $i_1$, $i_2$, and $i_3$ may need to be calibrated or adjusted to ensure that the actual CCT corresponds to the desired CCT. The tuning offset represents the difference between the curves for the model and tuned currents $i_1$, $i_2$, and $i_3$.

For single-point calibration, the tuning offset may be fixed multipliers that can be applied over the desired CCT range for the corresponding reference currents $i_1$, $i_2$, and $i_3$. Applying the fixed multipliers represents multiplying the reference currents $i_1$, $i_2$, and $i_3$ by corresponding percentages. In FIG. 13, the tuning offsets for the reference currents $i_1$, $i_2$, and $i_3$ may be 0.96 (96%), 1.04 (104%), and 1.06 (106%), respectively. As such, as reference currents $i_2$, and $i_3$ increase, the tuned currents $i_2$, and $i_3$ will increase at a greater rate. As reference current $i_1$ increases, the tuned current $i_1$ will increase at a lessor rate.

For example, a single calibration may take place at 25 C and a CCT of 4000 K wherein the tuning offsets are determined for each of the currents $i_1$, $i_2$, and $i_3$. The resultant tuning offsets for the currents $i_1$, $i_2$, and $i_3$ at 25 C and 4000 K may be applied to the respective model current curves. The effect is to shift each current curve up or down by a fixed percentage. As such, the same tuning offsets that are needed for currents $i_1$, $i_2$, and $i_3$ at 4000 K are applied at any selected CCT between 3000 K and 5000 K. The tuning offsets are implemented by multiplying the reference control signals R1, R2, and R3 by a percentage that causes the currents $i_1$, $i_2$, and $i_3$ to increase or decrease. As noted above, the reference control signals R1, R2, and R3 are altered with the tuning offsets to provide the tuned control signals T1, T2, and T3. The tuned control signals T1, T2, and T3 may be dynamically adjusted to compensate for temperature and dimming (output) levels.

While the fixed percentage-based tuning offsets may be used for calibration and manufacturing efficiency, other tuning offsets may be derived and applied. For example, the tuning offsets may be fixed magnitude offsets that are equally applied to all currents regardless of the CCT value. In a more complex scenario, an offset function can be derived for each of the currents $i_1$, $i_2$, and $i_3$ and applied to the control signals CS1, CS2, and CS3 over the CCT range.

The lighting fixture 10 need not immediately change from one CCT level to another in response to a user or other device changing the selected CCT level. The lighting fixture 10 may employ a fade rate, which dictates the rate of change for CCT when transitioning from one CCT level to another. The fade rate may be set during manufacture, by the commissioning tool 36, wall controller, or the like. For example, the fade rate could be 500 K per second. Assume the CCT levels for a 5% dimming level and a 100% dimming level are 3000 K and 5000 K, respectively. If the user or some event changed the dimming level from 5% to 100%, the CCT level may transition from 3000 K to 5000 K at a rate of 500 K per second. The transition in this example would take two seconds. The dimming rate may or may not coincide with the CCT fade rate. With a fade rate, changes in the selected CCT level may be transitioned in a gradual fashion to avoid abrupt switches from one CCT level to another.

Figure 18:
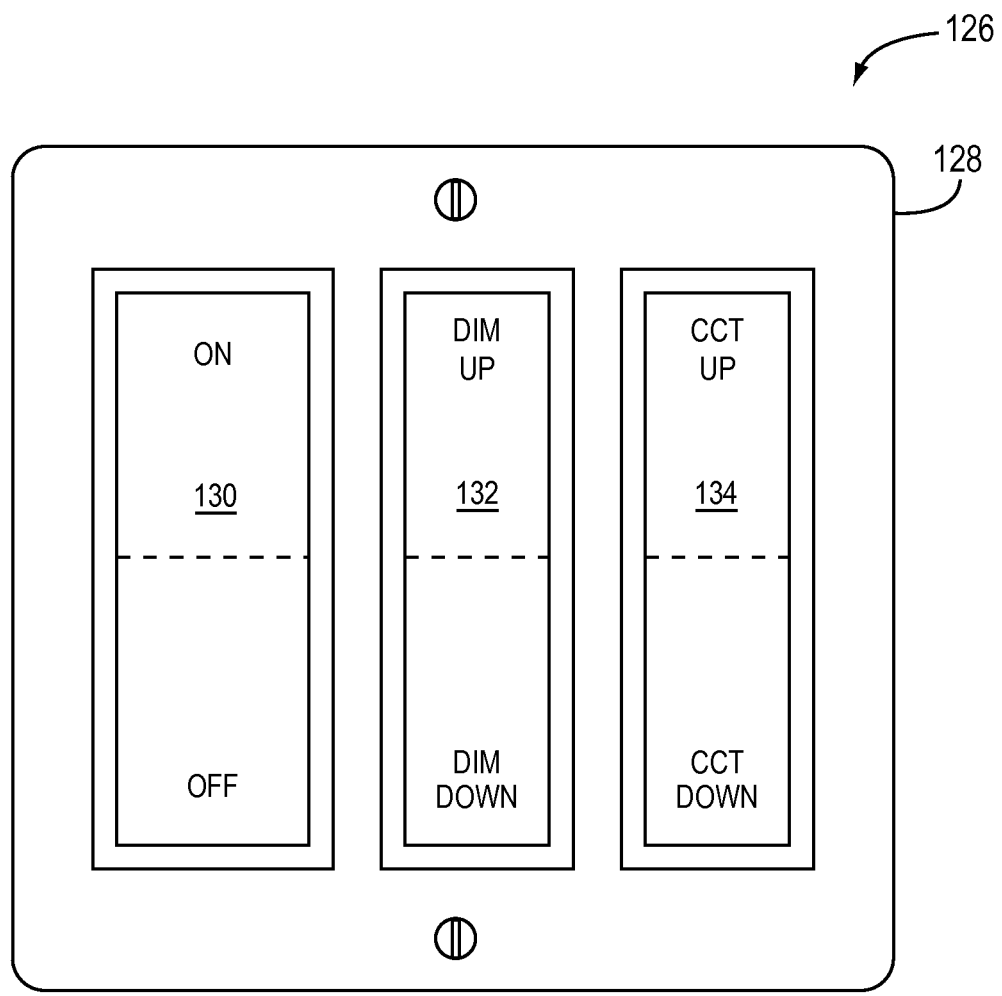
FIG. 18 is a wall controller for controlling one or more lighting fixtures according to a first embodiment.

With reference to FIG. 18, an exemplary wall controller 126 is illustrated. The wall controller 126 is shown in this embodiment with three buttons: an on-off button 130, a dimming button 132, and a CCT button 134. As will be described further below, the wall controller 126 may be hardwired to one or more lighting fixtures 10 or be configured to wirelessly communicate directly or indirectly with one or more lighting fixtures 10. The wired or wireless communications will support delivery of signals, messages, or instructions, which are hereafter referred to as signals, to the lighting fixtures 10. The wall controllers 126 may be configured to simply relay the various user inputs to the associated lighting fixture(s) 10 as soon as the user inputs are received. In this case, the lighting fixtures 10 will process the user inputs to determine the appropriate response to take. When the wall controllers 126 act primarily as a relay, the primary intelligence, or decision-making capability, resides in the lighting fixture(s) 10. Alternatively, significant processing and decision-making capability may be provided in the wall controller 126, wherein the wall controller 126 may process the various user inputs and determine how to instruct the lighting fixture(s) 10 based on various criteria, such as program rules, sensor information from local or remote sensors, prior user input, and the like.

When discussing the various examples described below, either of these configurations, or combination thereof, may be employed. For the relay embodiment, the user input is relayed to one or more lighting fixtures 10, which will process the user input and provide the requisite lighting response. When the wall controller 126 needs to provide a user perceptible response, the response may be initiated internally by the wall controller 126 based on available information or provided in response to instructions received from the lighting fixture 10. For example, if the wall controller 126 needs to control an LED that is located on the wall controller 126 to provide user feedback, this may be initiated internally or in response to a signal from a lighting fixture 10. With a more intelligent wall controller 126, the wall controller 126 may simply instruct the associated lighting fixture 10 to provide a specific lighting response, such as dim to 50% with a CCT of 3500 K, and control the LED accordingly. The lighting fixture 10 need not be aware of the LED control in this case.

When equipped for wireless communications, the wall controller 126 may act as a node in a multi-node wireless mesh network wherein certain nodes are lighting fixtures 10. For further information regarding mesh-network based lighting networks, reference is made to U.S. Pat. No. 9,155,165 issued on Oct. 6, 2015; U.S. Pat. No. 8,975,827 issued on Mar. 10, 2015; U.S. Pat. No. 9,155,166 issued on Oct. 6, 2015; U.S. Pat. No. 9,433,061 issued on Aug. 30, 2016; U.S. Pat. No. 8,829,821 issued on Sep. 9, 2014; U.S. Pat. No. 9,572,226 issued on Feb. 14, 2017; U.S. Pat. No. 8,912,735 issued on Dec. 16, 2014; U.S. patent application Ser. No. 13/838,398, filed Mar. 15, 2013; U.S. patent application Ser. No. 13/868,021, filed Apr. 22, 2013; and U.S. provisional patent application No. 61/932,058, filed Jan. 27, 2014, which are incorporated herein by reference in their entireties.

With the embodiment illustrated in FIG. 18, each of the three buttons (130, 132, 134) are shown as rocker switches wherein pressing the top half of the button invokes a first lighting control response and the pressing the bottom half of the button invokes a second lighting control response. For the on-off button 130, pressing the top half will result in the wall controller 126 sending a signal to turn on any associated lighting fixture(s) 10. Pressing the bottom half of the on-off button 130 will result in the wall controller sending a signal to turn off the associated lighting fixture(s) 10. As with any of these signals, the signals may be sent directly or indirectly through a network to the associated lighting fixture(s) 10.

The dimming button 132 is used to vary the light output level, or dimming level, of the associated lighting fixture(s) 10. For the dimming button 132, pressing the top half will result in the wall controller 126 sending a signal to increase the output light level of the associated lighting fixture(s) 10. Pressing the bottom half of the dimming button 132 will result in the wall controller sending a signal to decrease the output light level of the associated lighting fixture(s) 10. With each press of the top half or bottom half of the dimming button 132, the associated lighting fixture(s) 10 may be instructed to increase or decrease their output light levels by a defined amount. If the top half or bottom half of the dimming button 132 is held down, the associated lighting fixture(s) 10 may be instructed to continuously increase or decrease their output levels until the dimming button 132 is released.

The CCT button 134 is used to vary the CCT of the light output of the associated lighting fixture(s) 10. For the CCT button 134, pressing the top half will result in the wall controller 126 sending a signal to increase the CCT level of the associated lighting fixture(s) 10. Pressing the bottom half of the CCT button 134 will result in the wall controller sending a signal to decrease the CCT level of the associated lighting fixture(s) 10. With each press of the top half or bottom half of the CCT button 134, the associated lighting fixture(s) 10 may be instructed to increase or decrease their CCT by a defined amount. For example, each press of the top half or bottom half of the dimming button 132 may result in an increase or decrease of the CCT of the light output of the associated lighting fixture(s) 10 by 100 K. Alternately, each press could result in a 1, 5, 10, 50, 100, 250, or 500 K change in light output. If the top half or bottom half of the dimming button 132 is held down, the associated lighting fixture(s) 10 may be instructed to continuously increase or decrease their CCT levels until the CCT button 134 is released. The rate of change may be fixed or may change based on how long the CCT button 134 is held down. The longer the CCT button 134 is depressed, the faster the change in CCT.

Figure 19:
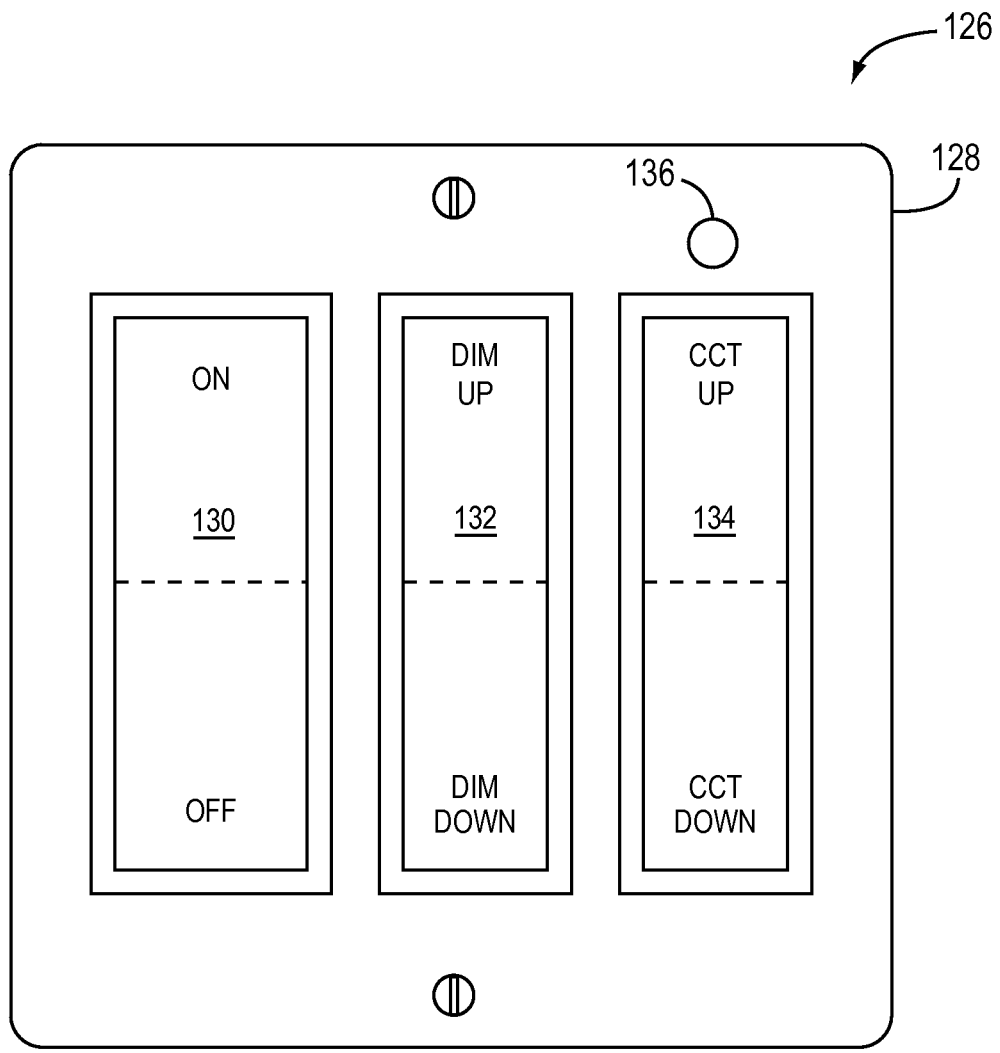
FIG. 19 is a wall controller for controlling one or more lighting fixtures according to a second embodiment.

A variation of the wall controller 126 of FIG. 18 is shown in FIG. 19. In this embodiment, a first CCT LED 136 is provided directly above the CCT button 134; however, the first CCT LED 136 could be provided anywhere on the wall controller 126. As with any of the features described in the embodiments, the first CCT LED 136 may be included with any feature and part of any embodiment of the invention. The first CCT LED 136 may be a variable color LED, which can output light of different colors and intensities depending on how it is driven. For example, the first CCT LED 136 may be configured to output light ranging from red to white to blue through a color spectrum in a continuous or graduated fashion. The particular color or brightness of the light provided by the first CCT LED 136 may correspond to the particular CCT level being set by the wall controller 126 in response to a user adjusting the CCT using the CCT button 134. For example, assume that the wall controller 126 is able to vary the CCT of any associated lighting fixtures 10 from 3000 K to 5000 K in 100 K increments. When the user has used the CCT button 134 to select the lowest CCT (3000 K), which corresponds to a warmer CCT, the first CCT LED 136 will be driven to omit a red light. When the user has used the CCT button 134 to select the highest CCT (5000 K), which corresponds to a cooler CCT, the first CCT LED 136 will be driven to omit a blue light. When the user has used the CCT button 134 to select the mid-ranged CCT (4000 K), which corresponds to a relatively neutral CCT, the first CCT LED 136 will be driven to omit a white light.

For those relatively warmer CCT levels between 3000 K and 4000 K, the light emitted from the first CCT LED 136 may transition gradually from red to orange to yellow to white, as the CCT level progresses in 100 K increments from 3000 K to 4000 K. For those relatively cooler CCTs levels between 4000 K and 5000 K, the light emitted from the first CCT LED 136 may transition gradually from white to green to blue, as the CCT level progresses in 100 K increments from 4000 K to 5000 K. In an alternative to gradually changing colors along the visible light spectrum to indicate relative CCT level, the first CCT LED 136 could be driven to change in intensity, wherein the warmer the CCT Level, the brighter the red light emitted will be. Conversely, the cooler the CCT level, the brighter the blue light emitted will be. The LED may be off or a very dim red, white, or blue at the mid-range CCT level. Those skilled in the art will recognize various ways to drive the first CCT LED 136 in a manner that causes the light emitted from the first CCT LED 136 to correspond in output, whether it is color, dimming level, or a combination thereof, to the current CCT level of the lighting fixture(s) 10 being controlled by the wall controller 126.

The wall controller 126 may control the first CCT LED 136 to emit light that is indicative of the CCT level continuously, when a user is changing the CCT level using the CCT button 134 and perhaps for a short while thereafter, or on a periodic basis. In the latter case, the first CCT LED 136 may flash periodically to provide an indication of CCT level.

Figure 20:
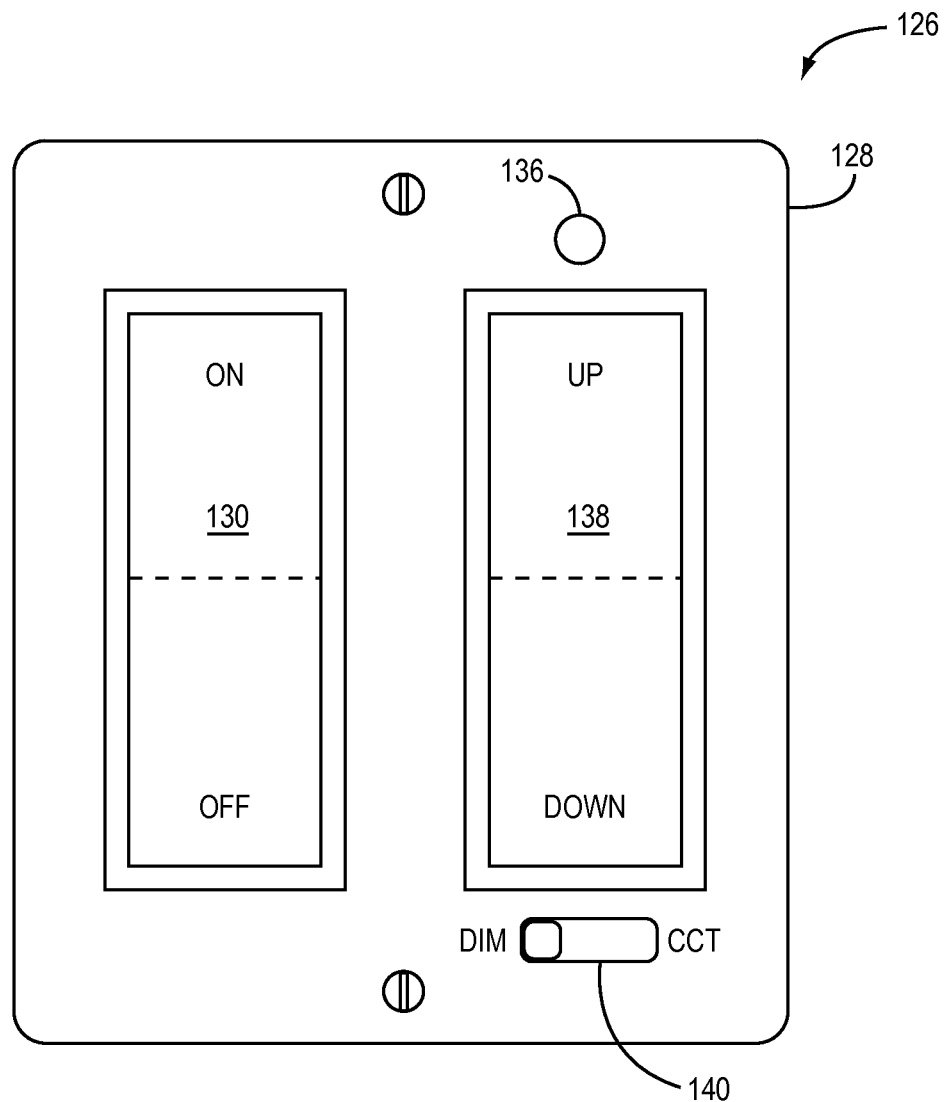
FIG. 20 is a wall controller for controlling one or more lighting fixtures according to a third embodiment.

FIG. 20 illustrates an alternative configuration for the wall controller 126. In essence, the operation and functionality of this wall controller 126 is analogous to that described above in association with FIG. 19. Instead of having a separate dimming button 132 and CCT button 134, a multifunction button 138 is provided along with a selection switch 140. The selection switch 140 can be toggled between a dim mode and a CCT mode. When in the dim mode, the multifunction button 138 operates like the dimming button 132. When in the CCT mode, the multifunction button 138 operates like the CCT button 134. Optionally, the first CCT LED 136 may be provided as described above and used such that the user has feedback as to the current or selected CCT level.

Figure 21:
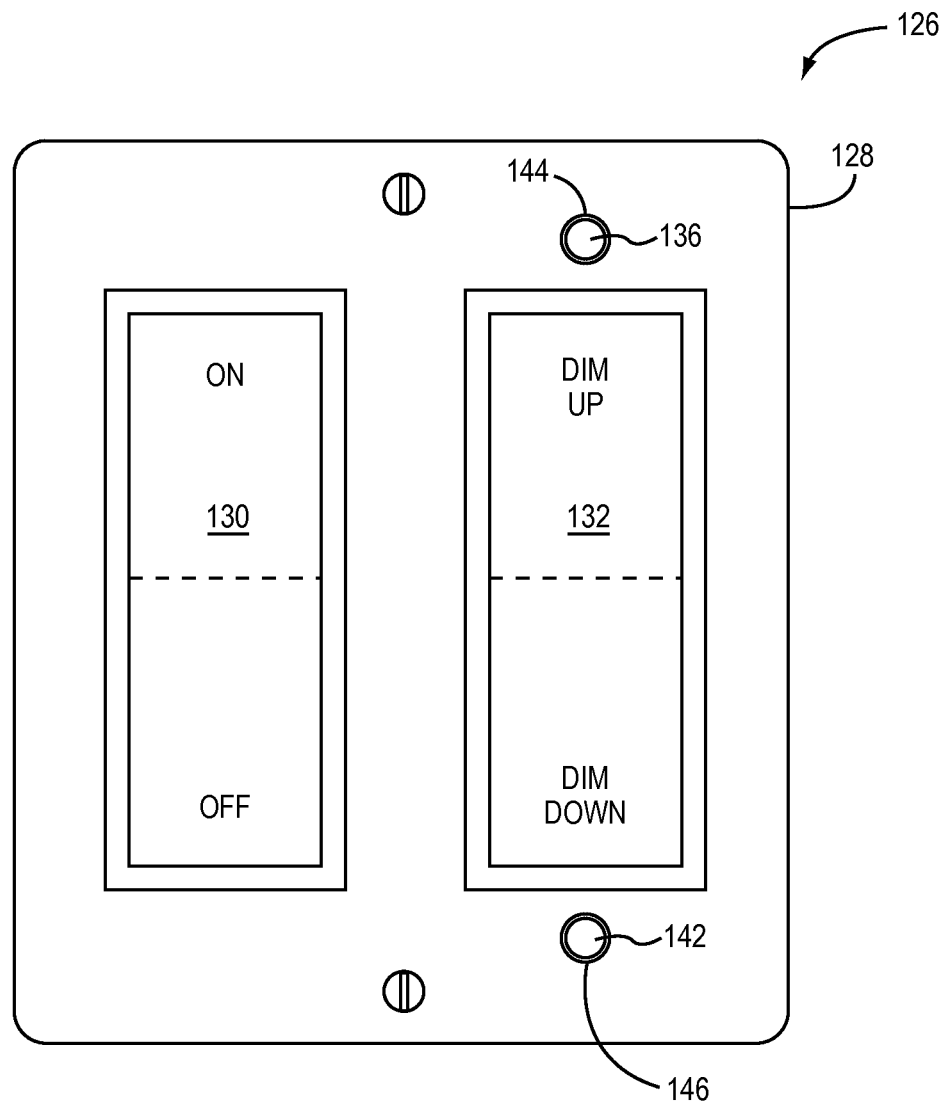
FIG. 21 is a wall controller for controlling one or more lighting fixtures according to a fourth embodiment.

Another embodiment of the wall controller 126 is illustrated in FIG. 21. The wall controller 126 has an on-off button 130 and a dimming button 132 that operates as described above. The wall controller 126 also includes a first CCT LED 136 and a second CCT LED 142. As illustrated, the first CCT LED 136 is located above the dimming button 132, and the second CCT LED 142 is located below the dimming button 132. The first CCT LED 136 is part of or associated with a first CCT button 144, and the second CCT LED 142 is part of or associated with a second CCT button 146. In the illustrated embodiment, the first CCT LED 136 and first CCT button 144 form a first push button switch, and the second CCT LED 142 and the second CCT button 146 form a second push button switch.

In one embodiment, the wall controller 126 may have minimum and maximum dimming levels that are selectable through interaction with the dimming button 132. The maximum dimming level may set to 100% of the maximum light output level or less (i.e. 90% of the maximum light output level). The minimum setting may be completely off or at lower dimming level, such as 5% of the maximum light output level. For the purposes of illustration only, assume that the maximum dimming level corresponds to 100% of the maximum light output level and that the minimum dimming level corresponds to 5% of the maximum light output level.

The wall controller 126 allows a user to select a first CCT level for the maximum dimming level using the first CCT button 144 and a second CCT level for the minimum dimming level using the second CCT button 146. The respective first and second CCT LEDs 136, 142 are used to provide feedback for the current or selected maximum and minimum CCT levels, respectively. For example, the first and second CCT LEDs 136, 142 may be controlled to cycle through a series of colors that sweep from red to blue though white to indicate the relative CCT levels (i.e. 3000 K (red), 4000 K (white), and 5000 K (blue)).

The wall controller 126 will thus receive user input via the first and second CCT buttons 144, 146 to set the first and second CCT levels for the corresponding maximum and minimum dimming levels. Once the first and second CCT levels are identified, the CCT level of the lighting fixtures 10 will transition from the second CCT level to the first CCT level as the dimming level changes from the minimum dimming level to the maximum dimming level.

For example, the wall controller 126 may receive user input via the first and second CCT buttons 144, 146 to set the first and second CCT levels to 5000 K and 3000 K, respectively. Assume the corresponding maximum and minimum dimming levels, which are 100% and 5%, respectively. Once the CCT levels are set, the wall controller 126 will send instructions to the lighting fixtures 10 to transition the CCT level from 3000 K to 5000 K as the dimming level changes from the minimum dimming level (5%) to the maximum dimming level (100%). The CCT levels and dimming levels will vary from application to application. Further, the lower dimming levels need not be associated with lower CCT levels, as the inverse may be desired in certain applications.

Figure 22:
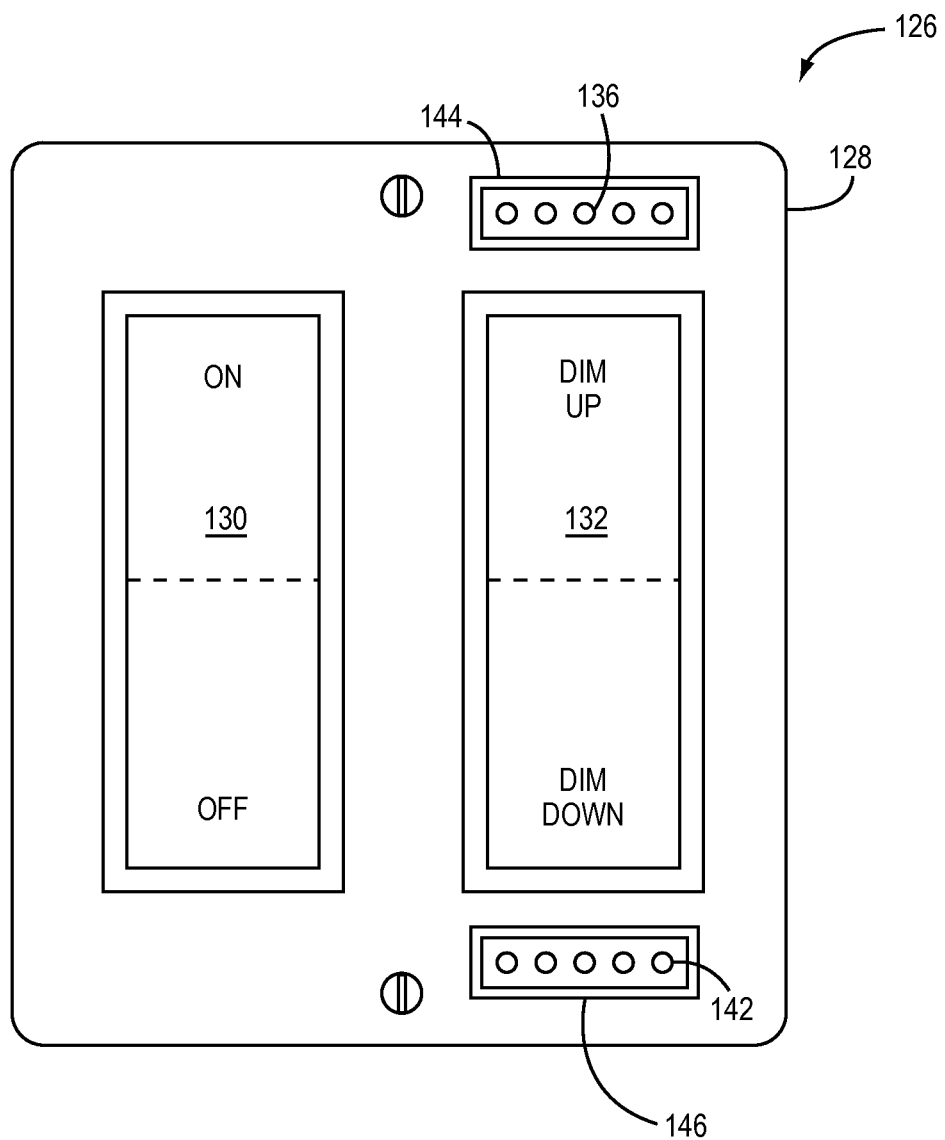
FIG. 22 is a wall controller for controlling one or more lighting fixtures according to a fifth embodiment.

FIG. 22 illustrates another variation on the concepts of FIG. 21. In this embodiment, the first and second CCT LEDs 136 and 142 are each formed by an array of LEDs. The LEDs in each array may be different colored LEDs or may be controlled to emit different colors of light, which may again transition from red to blue through white or other color spectrum. For example, if the arrays of LEDs have five individual LEDs as shown, the LEDs of the array of LEDs may transition from left to right as follows: red, yellow, white, green, and blue, wherein the CCT level associated with each LEDs transitions from the minimum CCT level for red to the maximum CCT level for blue. Again, the first and second CCT buttons 144 and 146 need not be integrated with the first and second CCT LEDs 136 and 142. Further, certain buttons on the wall controller 126 may support multiple functions and modes.

Notably, the first and second CCT LEDs 136 and 142 in the embodiments of FIGS. 21 and 22 may also be used to simply set a current CCT level for one or more associated lighting fixtures 10 by the user. In one mode, the user may set the maximum and minimum CCT levels for the maximum and minimum dimming levels. In another mode, the user may be able to change and set a fixed CCT level, regardless of dimming level or changes to dimming level.

Again, in any of the above embodiments, the primary control may be allocated to either the wall controller 126 or a lighting fixture 10. If control resides primarily in the wall controller 126, the user inputs may be processed alone or in conjunction with other criteria to determine how to instruct the lighting fixture 10 to operate. If control resides primarily in the lighting fixture 10, the user inputs are relayed to the lighting fixture 10, which will determine how to respond. The lighting fixture 10 may also determine how the wall controller 126 should respond and provide instructions to respond accordingly. For example, if the wall controller 126 can set an LED on the wall controller 126 to emit light at a color or intensity that is indicative of a current CCT or CCT setting, the lighting fixture 10 may instruct the wall controller 126 to emit light of a specific color based on the current state of the lighting fixture 10.

Figure 23:
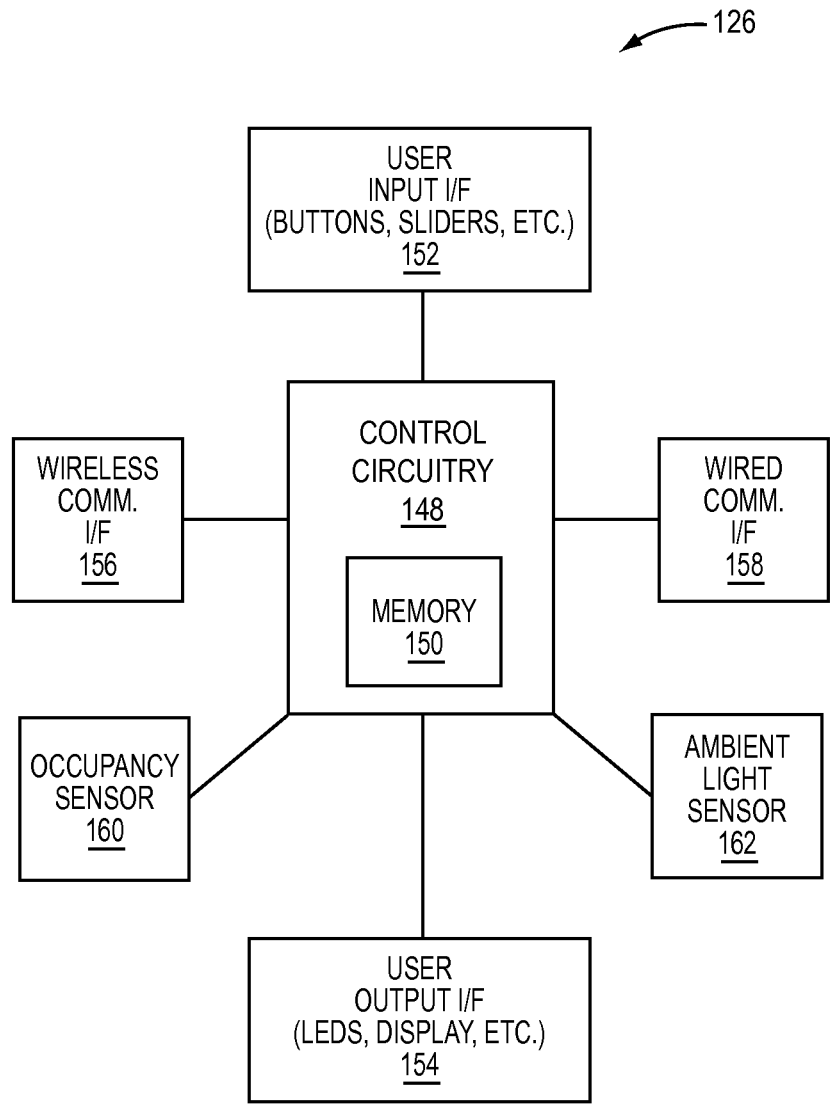
FIG. 23 is a schematic for a wall controller according to one embodiment.

An exemplary block diagram of the wall controller 126 is shown in FIG. 23. The wall controller 126 includes control circuitry 148, which is associated with memory 150 and configured to run the requisite software or firmware necessary to implement the functionality described herein. The control circuitry is associated with a user input interface (I/F) 152 and a user output interface (I/F) 154. As noted above, the user input interface 152 may include the various switches, rotary knobs, sliders, and buttons, such as the on-off button 130, dimming button 132, CCT button 134, first CCT button 144, second CCT button 146, and the like. The user input interface 152 may be arranged in various groups of switches, knobs, sliders, and buttons. The user input interface could also be a touch screen interface. The user output interface 154 may include the CCT LEDs 136, 142, other LEDs or indicators, a display, or the like. The display could form part of the touch screen interface.

The control circuitry 148 is also associated with one or both of a wireless communication interface 156 and a wired communication interface 158. The wireless communication interface 156 is configured to facilitate wireless communication directly with one or more associated lighting fixtures 10, a wireless network that includes the associated lighting fixtures, or the like. Virtually any type of wireless communication technique may be used including Bluetooth, wireless local area network (WLAN), and the like. Even infrared, acoustic, and optical communication techniques are possible.

In one embodiment, the wireless communication interface 156 is capable of communicating with the communication module 32 of at least one of the associated lighting fixtures 10. Each lighting fixture 10 may be configured to relay messages between other lighting fixtures 10 and the wall controller 126. The lighting fixtures 10 may also be able to receive a signal from a wall controller 126 and then control other lighting fixtures 10 based on that instruction. The wired communication interface 158 is designed to be directly wired to at least one of the associated lighting fixtures 10 and send the control signals over the wired connection.

In operation, the control circuitry 148 may receive user input via the user input interface 152 or information from the lighting fixtures 10 and commissioning tool 36. Based on this input or information, the control circuitry 148 can provide user feedback to the user via the user output interface 154, send instructions via an appropriate signal to one or more associated lighting fixtures 10 via the wireless or wired communication interfaces 156, 158, or both. For example, the control circuitry 148 can receive on-off commands, dimming levels, CCT settings, maximum or minimum CCT levels, and the like from the user input interface 152 as described above and provide output to the user via the user output interface 154 and the associated lighting fixtures 10. The output provided to the user may be controlling the color or intensity of the first and second CCT LEDs 136, 142. The signal provided to the lighting fixtures 10 may include the user input or instructions to turn on, turn off, set or transition to a certain CCT level, set or transition to a certain dimming level, and the like.

The wall controller 126 may also include various sensors, such as an occupancy sensor 160 and an ambient light sensor 162. The control circuitry 148 may simply relay the sensor outputs of the occupancy sensor 160 and the ambient light sensor 162 to the associated light fixtures 10 or use the sensor outputs to help determine how to control the associated light fixtures 10. For example, ambient light levels and occupancy information may affect whether the wall controller 126 will turn on or off the associated lighting fixtures 10 as well as what dimming levels and CCT levels to set based on a desired lighting schedule that is implemented in the wall controller 126, assuming the lighting schedule is not controlled by one of the associated lighting fixtures 10. The time of day, day of week, and date may also impact how the associated lighting fixtures 10 are controlled in general as well as in conjunction with the sensor outputs, user inputs, and the like.

Figure 24:
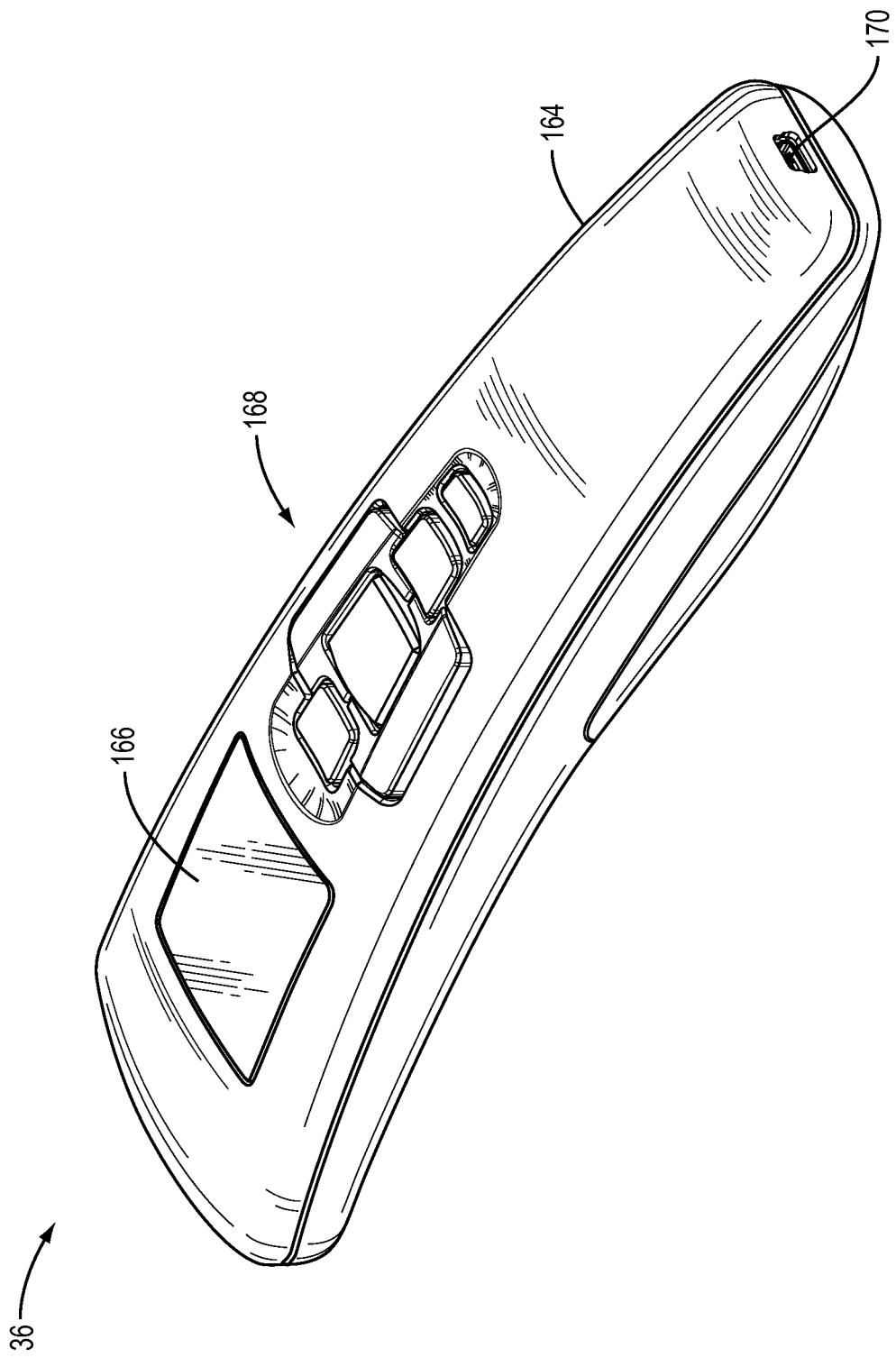
FIGS. 24 and 25 are different isometric views of an exemplary commissioning tool, according to one embodiment.
Figure 25:
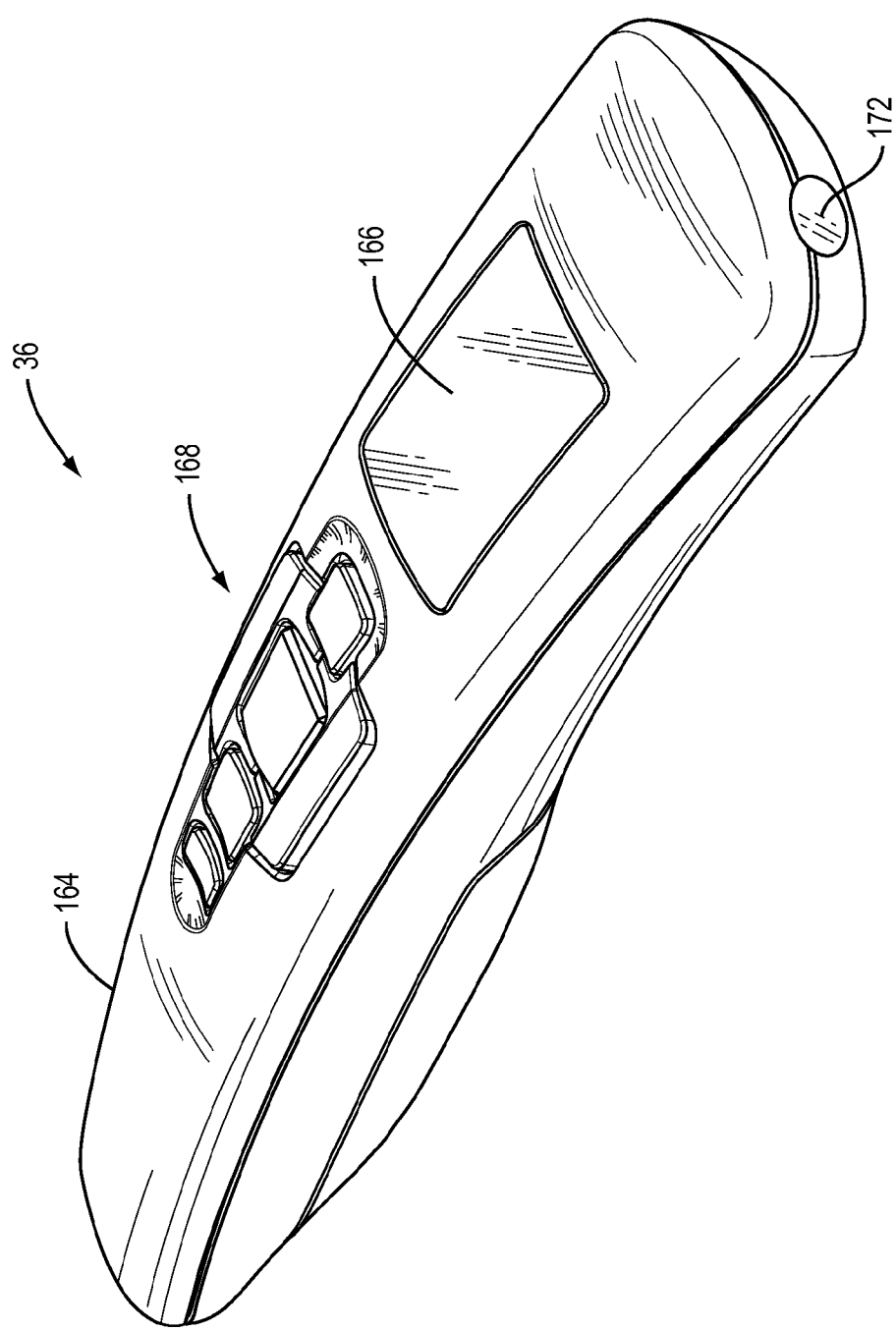

With reference to FIGS. 24 and 25, an exemplary commissioning tool 36 is illustrated. The commissioning tool 36 includes a housing 164 in which a display 166 and user buttons 168 are integrated. The display 166 may be configured as a touch screen device, wherein all or a portion of the user buttons 168 or like input mechanisms are effectively integrated with the display 166. A power and communication port 170 is shown on one end of the housing 164 in FIG. 24, and a light output port 172 is shown on the opposite end of the housing 164 in FIG. 25. The light output port 172 is the mechanism from which the a light beam may be projected. The electronics of the commissioning tool 36 are described below.

Figure 26:
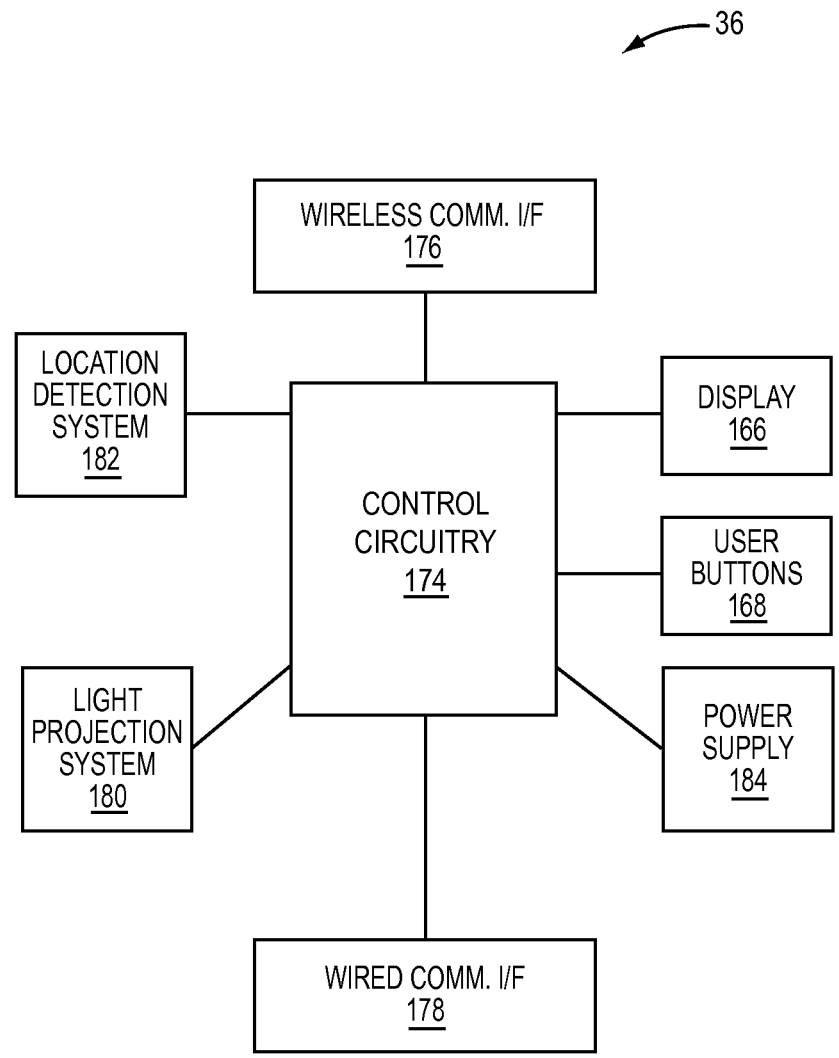
FIG. 26 is a block diagram of the electronics for a commissioning tool, according to one embodiment.

With reference to FIG. 26, electronics for the commissioning tool 36 may include control circuitry 174 that is associated with a wireless communication interface 176, a wired communication interface 178, a light projection system 180, location detection system 182, display 166, and the user buttons 168. The control circuitry 174 is based on one or more application-specific integrated circuits, microprocessors, microcontrollers, or like hardware, which are associated with sufficient memory to run the firmware, hardware, and software necessary to impart the functionality described herein.

Everything may be powered by a power supply 184, which may include a battery and any necessary DC-DC conversion circuitry to convert the battery voltage to the desired voltages for powering the various electronics. The display 166 and user buttons 168 provide a user interface that displays information to the user and allows a user to input information to the commissioning tool 36.

The wireless communication interface 176 facilitates wireless communications with the lighting fixtures 10 directly or indirectly via an appropriate wireless network. The wireless communication interface 176 may also be used to facilitate wireless communications with a personal computer, wireless network (WLAN), and the like. Virtually any communication standard may be employed to facilitate such communications, including Bluetooth, IEEE 802.11 (wireless LAN), near field, cellular, and the like wireless communication standards. The wired communication interface 178 may be used to communicate with a personal computer, wired network (LAN), lighting fixtures 10, and the like. The light projection system 180 may take various forms, such as a laser diode or light emitting diode that is capable of emitting a light signal that can be received by the lighting fixtures 10 via the ambient light sensor $S_A$ or other receiver mechanism.

For example, the light projection system 180 may be used to transmit a focused light signal that can be directed at and recognized by a specific lighting fixture 10 to select the lighting fixture 10. The selected lighting fixture 10 and the commissioning tool 36 can then start communicating with each other via the wireless communication interface 176 to exchange information and allow the instructions and data to be uploaded to the lighting fixture 10. In other embodiments, the commissioning tool 36 may query the addresses of the lighting fixtures 10 and systematically instruct the lighting fixtures 10 to control their light outputs to help identify each lighting fixture 10. Once the right lighting fixture 10 is identified, the commissioning tool 36 can beginning configuring or controlling the lighting fixture 10.

The commissioning tool 36 may be used to set any parameter in and control virtually any aspect of the lighting fixtures 10 and the wall controllers 126. For example, the commission tool can be used to set CCT levels, CCT fade rates, dimming rates, dimming levels, maximum and minimum CCT levels and dimming levels, and the like. The commissioning tool 36 can be used to provide all of the control that was described above for the wall controllers 126, and thus act as a remote control for the lighting fixtures 10, as well as programming tool for more complicated scheduling, parameter setting, and the like. After installation of a lighting fixture 10, the commissioning tool 36 can be used to set or change the CCT level for the lighting fixture 10 in virtually any increment for any light output level, a maximum dimming level, minimum dimming level, and the like as well as set the maximum and minimum dimming levels for the lighting fixtures 10. The commissioning tool 36 can also be used to program the wall controllers 126 to set parameters and perform various tasks in response to virtually any input, including user input, time of day, day of week, date, sensor data, and the like.

All of the control circuitry discussed herein for the lighting fixtures 10, wall controllers 126, and commissioning tool 36 is defined as hardware based and configured to run software, firmware, and the like to implement the described functionality. These systems are able to keep track of the time of day and day of week to implement scheduled programming.

Those skilled in the art will recognize improvements and modifications to the embodiments of the present disclosure. For example, the techniques disclosed herein may be employed in a lighting fixture that uses waveguide technology, such as that provided in International Application No. PCT/US14/13937, filed Jan. 30, 2014, entitled "Optical Waveguide Bodies and Luminaires Utilizing Same," which claims the benefit of U.S. Provisional Patent Application No. 61/922,017, filed Dec. 30, 2013, entitled "Optical Waveguide Bodies and Luminaires Utilizing Same," and which is a continuation-in-part of U.S. Pat. No. 9,519,095 issued Dec. 13, 2016, entitled "Optical Waveguides," the disclosures of which are incorporated herein in their entirety.

All such improvements and modifications are considered within the scope of the concepts disclosed herein and the claims that follow.

What is claimed is:

1. A lighting fixture comprising:
   at least two LED strings wherein each string of the at least two LED strings emits light at a different color point;
   a driver module configured to:
      store a current model for each string wherein each current model effectively defines current as a function of Correlated Color Temperature (CCT) over a CCT range;
      determine a desired CCT;
      generate a current for each string based on the desired CCT using a corresponding current model, such that the light from each string mixes to form white light with a color point within a seven-step MacAdam ellipse of a black body locus at the desired CCT;
      select a reference control signal for each current based on the desired CCT;
      receive a tuning offset for each current model and adjust each current model based on a corresponding tuning offset, wherein the tuning offset is a multiplier applied to each reference control signal to adjust each current such that a CCT of light output by the lighting fixture matches the desired CCT;
      receive information indicative of a new CCT; and
      generate a new current for each string based on the new CCT using a corresponding current model, such that the light from each string mixes to form the white light with a color point that falls along the black body locus at the new CCT.

2. The lighting fixture of claim 1 wherein the current model for each string further defines the current as a function of temperature and the driver module is further configured to receive a temperature and generate the current for each string based on the desired CCT and the temperature using the corresponding current model, such that the light from each string mixes to form the white light with a color point that falls along the black body locus at the desired CCT, regardless of the temperature.

3. The lighting fixture of claim 1 wherein the current model for each string further defines the current as a function of dimming level for the white light and the driver module is further configured to receive a desired dimming level and generate the current for each string based on the desired CCT and the desired dimming level using the corresponding current model, such that the light from each string mixes to form the white light with a color point that falls along the black body locus at the desired CCT and with the desired dimming level.

4. The lighting fixture of claim 3 wherein the driver module is further configured to associate a first dimming level with a first CCT and a second dimming level with a second CCT, such that as the dimming level progresses from the first dimming level to the second dimming level, the desired CCT will proportionately progress from the first CCT to the second CCT along the black body locus, and vice versa.

5. The lighting fixture of claim 1 wherein each tuning offset is an adjustment corresponding to a single point calibration.

6. The lighting fixture of claim 1 wherein the current model for each string further defines the current as a function of temperature and dimming level, the driver module further configured to receive a temperature and a desired dimming level and generate the current for each string based on the desired CCT, the temperature, and the desired dimming level using the corresponding current model, such that the light from each string mixes to form the white light with a color point that falls along the black body locus at the desired CCT and with the desired dimming level, regardless of the temperature.

7. The lighting fixture of claim 1 wherein a CCT range is at least 3000 K to 5000 K.

8. The lighting fixture of claim 1 wherein a CCT range is at least 2700 K to 5700 K.

9. The lighting fixture of claim 1 wherein a CCT range is at least 3000 K to 4000 K.

10. The lighting fixture of claim 1 wherein the lighting fixture is controlled by another lighting fixture and the desired CCT is received from another lighting fixture.

11. The lighting fixture of claim 1 wherein the desired CCT is received from a commissioning tool.

12. The lighting fixture of claim 1 wherein the desired CCT is received from a wall controller.

13. The lighting fixture of claim 1 wherein the desired CCT is selected based on one of time of day, day of week, and date by the driver module.

14. The lighting fixture of claim 1 wherein the at least two LED strings comprises a string of wavelength converted LEDs of essentially a first color with a first color point on a CIE 1976 chromaticity diagram; a string of wavelength converted LEDs of essentially a second color with a second color point on the CIE 1976 chromaticity diagram; and a string of LEDs of essentially a third color with a third color point on the CIE 1976 chromaticity diagram such that a difference in v' of the first color point and the second color point is greater than 0.033 wherein v' corresponds to a horizontal position on the CIE 1976 chromaticity diagram.

15. The lighting fixture of claim 14 wherein the difference in v' of the first color point and the second color point is greater than 0.0400 and less than 0.1500.

16. The lighting fixture of claim 14 wherein the difference in v' of the first color point and the second color point is greater than 0.0500 and less than 0.1500.

17. The lighting fixture of claim 14 wherein the driver module is configured to provide a first current to the string of wavelength converted LEDs of essentially the first color; a second current to the string of wavelength converted LEDs of essentially the second color; and a third current to the string of LEDs of essentially the third color to form the white light with a color point that falls along the black body locus.

18. The lighting fixture of claim 17 wherein the driver module is further configured to variably control ratios of the first, second, and third currents such that a correlated color temperature for the white light is adjustable along the black body locus from about 3000 K to about 4000 K.

19. The lighting fixture of claim 18 wherein the string of wavelength converted LEDs of essentially the first color consists essentially of blue-shifted LEDs, the string of wavelength converted LEDs of essentially the second color consists essentially of blue-shifted LEDs, and the string of LEDs of essentially the third color consists essentially of red LEDs.

20. The lighting fixture of claim 1 wherein the at least two LED strings comprises a string of LEDs of essentially a first color with a first color point on a CIE 1976 chromaticity diagram; a string of LEDs of essentially a second color with a second color point on the CIE 1976 chromaticity diagram; and a string of LEDs of essentially a third color with a third color point on the CIE 1976 chromaticity diagram such that a difference in v' of the first color point and the second color point is greater than 0.033.

21. The lighting fixture of claim 20 wherein the driver module is configured to provide a first current to the string of LEDs of essentially the first color; a second current to the string of LEDs of essentially the second color; and a third current to the string of LEDs of essentially the third color to form the white light with a color point that falls along the black body locus.

22. The lighting fixture of claim 21 wherein the driver module is further configured to variably control ratios of the first, second, and third currents such that a correlated color temperature for the white light is adjustable along the black body locus from about 3000 K to about 4000 K.

23. The lighting fixture of claim 1 wherein the driver module is further configured to receive a fade rate, wherein the driver module will generate a current for each string to cause the white light to transition from the desired CCT to the new CCT along the black body locus at the fade rate.

24. The lighting fixture of claim 1 wherein the light from each string mixes to form white light with a color point within a two-step MacAdam ellipse of a black body locus at the desired CCT.

25. The lighting fixture of claim 1, wherein the driver module comprises a DC-DC converter for each string, where each DC-DC converter is configured to generate a current for its respective string.

26. A lighting fixture comprising:
at least two LED strings, wherein each string of the at least two LED strings emits light;
a driver module configured to:
store a current model for each string wherein each current model effectively defines current as a function of Correlated Color Temperature (CCT) over a CCT range;
determine a desired CCT;
generate a current for each string based on the desired CCT using a corresponding current model, such that the light from each string mixes to form white light with a color point within a seven-step MacAdam ellipse of a black body locus at the desired CCT;
select a reference control signal for each current based on the desired CCT;
receive a tuning offset for each current model and adjust each current model based on a corresponding tuning offset, wherein the tuning offset is a multiplier applied to each reference control signal to adjust each current such that a CCT of light output by the lighting fixture matches the desired CCT;
receive information indicative of a new CCT; and
generate a new current for each string based on the new CCT using a corresponding current model, such that the light from each string mixes to form the white light with a color point that falls along the black body locus at the new CCT.

27. The lighting fixture of claim 26 wherein the white light has a color rendering index level above 90.

28. The lighting fixture of claim 27 wherein the CCT range is at least 3000 K to 4000 K.

29. The lighting fixture of claim 28 wherein the current model for each string further defines the current as a function of temperature and dimming level, the driver module further configured to receive a temperature and a desired dimming level and generate the current for each string based on the desired CCT, the temperature, and the desired dimming level using the corresponding current model, such that the light from each string mixes to form the white light with a color point that falls along the black body locus at the desired CCT and with the desired dimming level, regardless of the temperature.

30. The lighting fixture of claim 26 wherein the light from each string mixes to form white light with a color point within a two-step MacAdam ellipse of a black body locus at the desired CCT.

\* \* \* \* \*